US012805025B2

(12) United States Patent
Senapati et al.

(10) Patent No.: US 12,805,025 B2
(45) Date of Patent: Nov. 17, 2026

(54) CO-INTEGRATION OF PASSIVE DEVICE AND VERTICALLY STACKED NANOSHEETS

(71) Applicant: INTERNATIONAL BUSINESS MACHINES CORPORATION, Armonk, NY (US)

(72) Inventors: Biswanath Senapati, Mechanicville, NY (US); Shahrukh Khan, Sandy Hook, CT (US); Utkarsh Bajpai, Delmar, NY (US); Ruilong Xie, Niskayuna, NY (US); Jay William Strane, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 429 days.

(21) Appl. No.: 18/528,746

(22) Filed: Dec. 4, 2023

(65) Prior Publication Data

US 2025/0185377 A1 Jun. 5, 2025

(51) Int. Cl.

| | |
|---|---|
| ***H10D 89/60*** | (2025.01) |
| ***H10D 8/01*** | (2025.01) |
| ***H10D 30/01*** | (2025.01) |
| ***H10D 30/43*** | (2025.01) |
| ***H10D 30/67*** | (2025.01) |
| ***H10D 62/10*** | (2025.01) |

(52) U.S. Cl.

CPC ........... *H10D 89/911* (2025.01); *H10D 8/045* (2025.01); *H10D 30/014* (2025.01); *H10D 30/43* (2025.01); *H10D 30/6735* (2025.01); *H10D 62/121* (2025.01)

(58) Field of Classification Search

CPC ........... H10D 84/0107; H10D 84/0109; H10D 84/40; H10D 84/401; H10D 84/811; H10D 8/045; H10D 8/00

See application file for complete search history.

(56) References Cited

U.S. PATENT DOCUMENTS

| | | | | |
|---|---|---|---|---|
| 9,450,050 | B2 | 9/2016 | Bobde | |
| 10,504,890 | B2 | 12/2019 | Cheng | |
| 11,101,374 | B1 | 8/2021 | Reznicek | |
| 11,646,306 | B2 | 5/2023 | Frougier | |
| 2018/0102359 | A1* | 4/2018 | Cheng | H10D 8/045 |
| 2022/0415878 | A1* | 12/2022 | Wu | H10D 8/50 |
| 2023/0087444 | A1* | 3/2023 | Thomson | H10D 64/017 257/351 |
| 2023/0361112 | A1* | 11/2023 | Hong | H10D 8/00 |
| 2024/0282670 | A1* | 8/2024 | Yang | H10D 84/0149 |

* cited by examiner

*Primary Examiner* — Alia Sabur

(74) *Attorney, Agent, or Firm* — Scully, Scott, Murphy & Presser, P.C.; Kristofer Haggerty

(57) ABSTRACT

A semiconductor device includes a passive device over vertically stacked epitaxial layers of a first material and a second material, and a field-effect transistor (FET) adjacent to the passive device. A backside of the passive device and a backside of the PET are directly in contact with a backside metal via a bottom interlayer dielectric (BILD).

19 Claims, 36 Drawing Sheets

100

LOGIC DEVICE 110A PASSIVE DEVICE 110B

CO-INTEGRATION OF PASSIVE DEVICE AND VERTICALLY STACKED NANOSHEETS

BACKGROUND

Technical Field

The present disclosure generally relates to transistors, and more particularly, to passive devices and stacked transistors, and methods of creation thereof.

Description of the Related Art

In an integrated circuit (IC) with nanosheet field-effect transistors (FETs) and passive devices, nanosheet FETs are used to perform active functions such as signal amplification and logic operations. Various passive devices are integrated alongside nanosheet FETs to provide relevant passive functions: resistors can be used for voltage division and current limiting; capacitors can store and release electrical energy and filter out high-frequency noise; and inductors can be employed in applications requiring energy storage or frequency-dependent impedance.

SUMMARY

According to an embodiment, a semiconductor device includes a passive device over vertically stacked epitaxial layers of a first material and a second material, and a field-effect transistor (FET) adjacent to the passive device. A backside of the passive device and a backside of the FET are directly in contact with a backside metal via a backside interlayer dielectric (BILD).

In some embodiments, which can be combined with the previous embodiment, the passive device is a P/N junction diode.

In some embodiments, which can be combined with one or more previous embodiments, each electrode of the P/N junction diode is separated by a gate electrode of the vertically stacked epitaxial layers.

In some embodiments, which can be combined with one or more previous embodiments, the passive diode includes a junction diode, an electrostatic discharging device (ESD), or a bipolar junction transistor (BJT).

In some embodiments, which can be combined with one or more previous embodiments, the first material includes Si, and the second material includes SiGe.

In some embodiments, which can be combined with one or more previous embodiments, the FET includes a vertically stacked FET. The vertically stacked FET includes a top nanosheet FET stacked over a bottom nanosheet FET.

In some embodiments, which can be combined with one or more previous embodiments, source/drain (S/D) regions of the top nanosheet FET are connected to a frontside of the semiconductor device via top S/D contacts. A gate region of the top nanosheet FET is connected to the frontside of the semiconductor device via a top gate contact.

In some embodiments, which can be combined with one or more previous embodiments, an S/D region of the bottom nanosheet FET is connected to a backside of the semiconductor device via backside contact.

In some embodiments, which can be combined with one or more previous embodiments, the passive device is separated from the vertically stacked epitaxial layers via a silicon layer.

According to an embodiment, a method for forming a semiconductor device includes forming a passive device over vertically stacked epitaxial layers of a first material and second material over a substrate. A field-effect transistor (FET) is formed adjacent to the passive device over the substrate. The substrate is removed. A backside interlayer dielectric (BILD) is formed over a backside of the passive device and a backside of the FET.

In some embodiments, which can be combined with the previous embodiment, the passive device is a P/N junction diode.

In some embodiments, which can be combined with one or more previous embodiments, the method includes separating each electrode of the P/N junction diode by a gate electrode of the vertically stacked epitaxial layers.

In some embodiments, which can be combined with one or more previous embodiments, the passive diode includes a junction diode, an electrostatic discharging device (ESD), or a bipolar junction transistor (BJT).

In some embodiments, which can be combined with one or more previous embodiments, the first material includes Si, and the second material includes SiGe.

In some embodiments, which can be combined with one or more previous embodiments, forming the FET includes stacking a top nanosheet FET over a bottom nanosheet FET.

In some embodiments, which can be combined with one or more previous embodiments, the method includes connecting S/D regions of the top nanosheet FET to a frontside of the semiconductor device via top S/D contacts and connecting a gate region of the top nanosheet FET to the frontside of the semiconductor device via a top gate contact.

In some embodiments, which can be combined with one or more previous embodiments, the method includes connecting an S/D region of the bottom nanosheet FET to a backside of the semiconductor device via backside contact.

In some embodiments, which can be combined with one or more previous embodiments, the method includes isolating the passive device from the vertically stacked epitaxial layers via a silicon layer.

In some embodiments, which can be combined with one or more previous embodiments, the method includes forming a bottom metal over a bottom surface of the BILD.

According to yet another embodiment, a semiconductor device includes a passive device over a substrate, wherein the substrate includes vertically stacked epitaxial layers of a first material and a second material, and a field-effect transistor (FET) adjacent to the passive device. The passive device is separated from the vertically stacked epitaxial layers via a silicon layer.

These and other features will become apparent from the following detailed description of illustrative embodiments thereof, which is to be read in connection with the accompanying drawings.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all the components or steps that are illustrated. When the same numeral appears in different drawings, it refers to the same or like components or steps.

DETAILED DESCRIPTION

Overview

Figure 1:
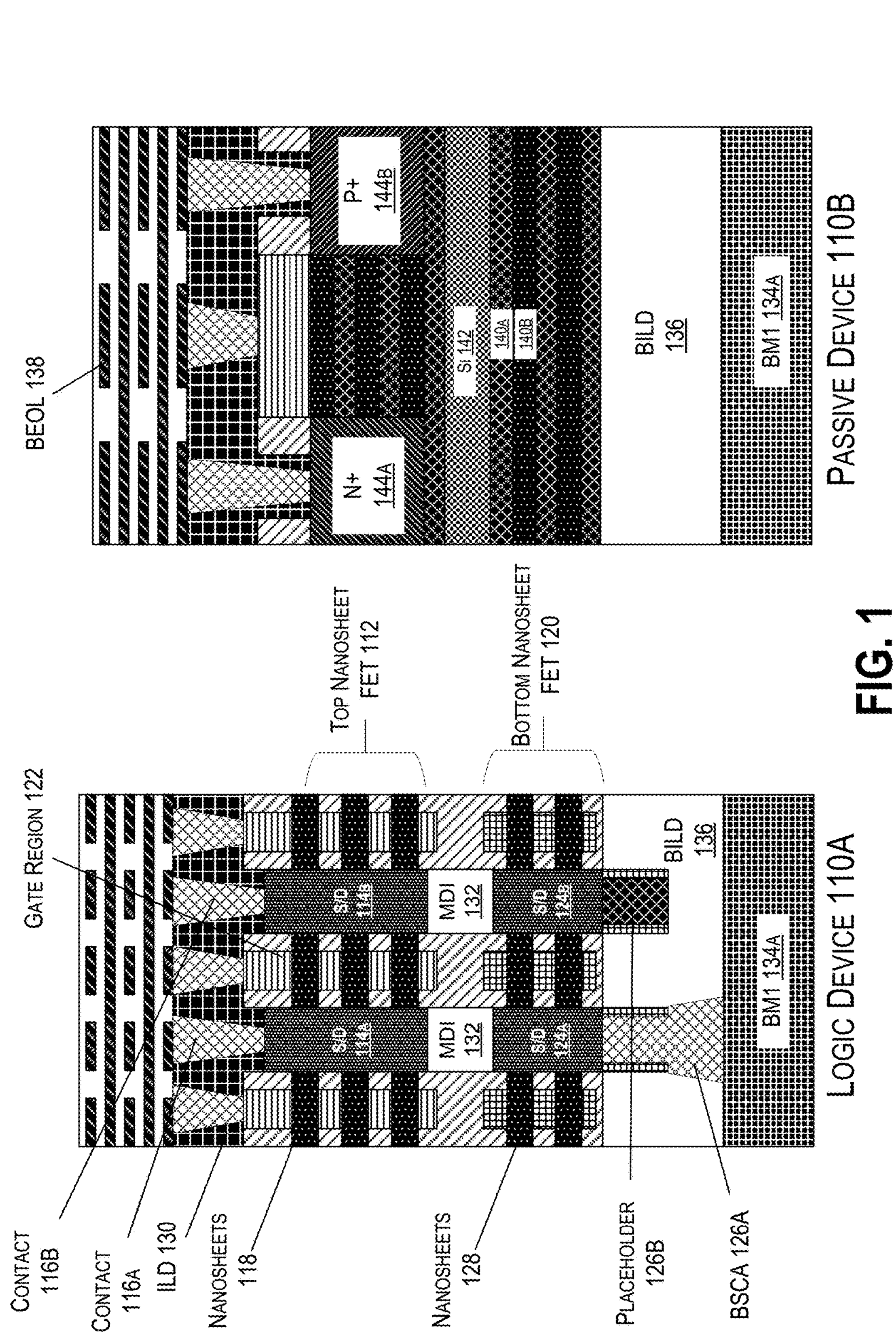
FIG. 1 illustrates a semiconductor device, in accordance with some embodiments.

In the following detailed description, numerous specific details are set forth by way of examples to provide a thorough understanding of the relevant teachings. However, it should be apparent that the present teachings may be practiced without such details. In other instances, well-known methods, procedures, components, and/or circuitry have been described at a relatively high-level, without detail, to avoid unnecessarily obscuring aspects of the present teachings.

In one aspect, spatially related terminology such as "front," "back," "top," "bottom," "beneath," "below," "lower," above," "upper," "side," "left," "right," and the like, is used with reference to the orientation of the Figures being described. Since components of embodiments of the disclosure can be positioned in a number of different orientations, the directional terminology is used for purposes of illustration and is in no way limiting. Thus, it will be understood that the spatially relative terminology is intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

As used herein, the terms "lateral" and "horizontal" describe an orientation parallel to a first surface of a chip.

As used herein, the term "vertical" describes an orientation that is arranged perpendicular to the first surface of a chip, chip carrier, or semiconductor body.

As used herein, the terms "coupled" and/or "electrically coupled" are not meant to mean that the elements must be directly coupled together-intervening elements may be provided between the "coupled" or "electrically coupled" elements. In contrast, if an element is referred to as being "directly connected" or "directly coupled" to another element, there are no intervening elements present. The term "electrically connected" refers to a low-ohmic electric connection between the elements electrically connected together.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

Example embodiments are described herein with reference to cross-sectional illustrations that are schematic illustrations of idealized or simplified embodiments (and intermediate structures). As such, variations from the shapes of the illustrations as a result, for example, of manufacturing techniques and/or tolerances, may be expected. Thus, the regions illustrated in the figures are schematic in nature and their shapes do not necessarily illustrate the actual shape of a region of a device and do not limit the scope.

It is to be understood that other embodiments may be used and structural or logical changes may be made without departing from the spirit and scope defined by the claims. The description of the embodiments is not limiting. In particular, elements of the embodiments described hereinafter may be combined with elements of different embodiments.

As used herein, certain terms are used indicating what may be considered an idealized behavior, such as, for example, "lossless," "superconductor," or "superconducting," which are intended to cover functionality that may not be exactly ideal but is within acceptable margins for a given application. For example, a certain level of loss or tolerance may be acceptable such that the resulting materials and structures may still be referred to by these "idealized" terms.

The concepts herein relate to stacked field-effect transistors (FET), which are fundamental electronic devices that have revolutionized the field of electronics and how various elements of the transistors are electrically connected. The stacked FET is a type of transistor architecture that offers improved functionality and benefits in integrated circuit (IC) design. The stacked FET involves stacking multiple FETs on top of each other, allowing for enhanced performance and increased integration density.

In nanosheet FET architecture, the substrate is blocked off to form vertically implanted junctions. Silicon-on-insulator (SOI) structures, such as lateral diode structures, are possible solutions. However, the problem with stacked FET is that it is a difficult task to have both N-type and P-type source/drain regions (S/D) on the same level. In the case of passives/diodes, to have the bulk-like function, the remaining silicon substrate should have a thickness of at least 100 nanometers.

Further, when the nanosheet stacked FETs or non-stacked FETs are integrated with the backside power delivery network (BSPDN), the backside silicon substrate is fully recessed and therefore is not available for the implanted junction.

To tackle the above-mentioned considerations, disclosed is a semiconductor device that enables the co-integration of passive devices, e.g., diodes, with nanosheet FETs with N-type and P-type source/drain regions on the same level and epitaxially formed junctions. The disclosed semiconductor device eliminates the silicon substrate, thus enabling connecting the semiconductor device to other devices on both frontside and backside. Further, the disclosed semiconductor device can include passive devices that do not require silicon substrate for backside power delivery networks. In other words, the disclosed semiconductor device uses the epitaxially-formed stack as the substrate for forming the passive device.

Accordingly, the teachings herein provide methods and systems of semiconductor device formation with co-integrated passive devices and nanosheet FETs. The techniques described herein may be implemented in a number of ways. Example implementations are provided below with reference to the following figures.

Example Semiconductor Device with Co-Integrated Passive Devices and Nanosheet FETs Structure Reference now is made to FIG. 1, which is a simplified cross-section view of a semiconductor device 100, consistent with an illustrative embodiment. In various embodiments, the semiconductor device 100 includes a stacked FET that leverages the vertical dimension of the semiconductor device 100 to increase the number of active devices within a given area. This way, instead of relying solely on lateral scaling, where semiconductor devices are shrunk in size on the semiconductor substrate, stacking FETs vertically can enable the incorporation of multiple layers of semiconductor devices. This arrangement enables more complex circuitry and advanced functionality.

In several embodiments, the stacked FET structure within the semiconductor device 100 can enable higher integration densities by utilizing the vertical dimension of the semiconductor device 100. In such embodiments, instead of relying solely on lateral scaling, which has its limits, stacking FETs on the semiconductor device 100 allows for increased transistor count within a given chip area. This increased transistor count enables the integration of more complex circuits, larger memory arrays, and other functional blocks, enhancing the capabilities of the semiconductor device 100.

The disclosed semiconductor device 100 can include a logic device 110A cointegrated with a passive device 110B. The logic device 110A includes a top nanosheet FET 112 over a bottom nanosheet FET 120. The top nanosheet FET 112 includes a first source/drain region 114A, a second source/drain region 114B, a first contact 116A, a second contact 116B, and a first set of nanosheets 118. The bottom nanosheet FET 120 includes a third source/drain region 124A, a fourth source/drain region 124B, a backside contact, BSCA, 126A, a placeholder 126B, and a second set of nanosheets 128. The top nanosheet FET 112 is flipped and stacked over the bottom nanosheet FET 120. The logic device 110A further includes a gate region 122, and an interlayer dielectric, ILD, 130. The passive device 110B includes vertically stacked epitaxial layers of a first material 140A and a second material 140B, a silicon layer 142, an N-type section 144A, and a P-type section 144B. The semiconductor device 100 further includes a middle dialectic isolation, MDI, 132, a backside metal layer, BM1, 134A, a bottom ILD, BILD, 136, and a back end of line, BEOL, 138. In some embodiments, each electrode of the passive device 110B is separated by a gate electrode of the vertically stacked epitaxial layers.

Generally, the first source/drain region 114A, the second source/drain region 114B, the third source/drain region 124A, and the fourth source/drain region 124B are salient components that play relevant roles in the semiconductor device's operation. In various embodiments, the first source/drain region 114A, the second source/drain region 114B, the third source/drain region 124A, and the fourth source/drain region 124B are regions within the semiconductor material, e.g., the semiconductor device 100, where the current flows in and out of the semiconductor device 100. The source region is the region through which the majority of charge carriers (e.g., electrons or holes) enter the channel of the semiconductor device and is responsible for providing the current that flows through the semiconductor device. The source region is typically doped to have an excess of charge carriers, creating a region with high carrier concentration. This abundance of carriers allows for the efficient injection of electrons or holes into the channel when a voltage is applied.

The drain region, on the other hand, is the region where the majority of charge carriers exit the channel. The drain region receives the current from the channel and carries the charge away from the transistor. Similar to the source, the drain region is also doped to have a high carrier concentration. The doping profile in the drain region ensures that carriers can easily flow out of the channel and into the drain region.

In some embodiments, the first source/drain region 114A and the second source/drain region 114B of the top nanosheet FET 112 are connected to a frontside of the semiconductor device 100 via the first contact 116A and the second contact 116B, respectively. In some embodiments, a gate region of the top nanosheet FET 110 is connected to the frontside of the semiconductor device 100 via a top gate contact. In an embodiment, one of the source/drain regions of the bottom nanosheet FET 120 is connected to the backside of the semiconductor device 100 via the BSCA 126A.

The first contact 116A, located over the first source/drain region 114A, establishes a connection between the first source/drain region 114A and the BEOL 138. The first contact 116A ensures efficient electrical routing and connectivity within the semiconductor device 100. The fabrication of the first contact 116A can involve lithography and etching processes to define the contact area. The first contact 116A can be made using conductive materials such as a silicide liner, e.g., Ni, Ti, NiPt, an adhesion metal layer, e.g., TiN and conductive metal fill material, e.g., tungsten (W), Co, or Ru.

The second contact 116B, located over the second source/drain region 114B, establishes a connection between the second source/drain region 114B and the BEOL 138. The second contact 116B ensures efficient electrical routing and connectivity within the semiconductor device 100. The fabrication of the second contact 116B can involve lithography and etching processes to define the contact area. The second contact 116B can be made using conductive materials such as a silicide liner, e.g., Ni, Ti, NiPt, an adhesion metal layer, e.g., TiN and conductive metal fill material, e.g., tungsten (W), Co, or Ru.

The BSCA 126A is a region on the backside of the semiconductor device 100 where electrical connections are made. By establishing the electrical contacts, the BSCA 126A ensures the proper functioning of the semiconductor device 100 and facilitates electrical signal transmission.

The BSCA 126A can serve as a thermal interface between the semiconductor device 100 and a heat sink or other cooling mechanisms. By establishing direct contact with the substrate, the BSCA 126A can conduct the heat away from the semiconductor device 100, and contribute to improved thermal dissipation. In some embodiments, the BSCA 126A can help mitigate parasitic effects, such as substrate coupling or substrate noise, from the semiconductor device 100. In further embodiments, the BSCA 126A can allow for increased integration density in the semiconductor device 100. In an embodiment, the BSCA 126A connects, i.e., wires, the first source/drain region 114A to the BM1 134A.

In various embodiments, the gate region 122 serves as control elements that regulate the flow of current through the semiconductor device 100. The gate region 122 can be composed of a conductive material. The gate region 122 can control the flow of electric current between the source and drain regions. In some embodiments, by applying a voltage to the gate, the channel region's conductivity is modulated, allowing the semiconductor device 100 to either allow or block the flow of current, which in turn enables the semiconductor device 100 to act as electronic switches or amplifiers. The gate voltage can determine whether the semiconductor device 100 is in an "on" or "off" state. When the gate voltage is below a certain threshold, the semiconductor device 100 is in the "off" state, and the current flow between the source and drain is effectively blocked. On the other hand, when the gate voltage exceeds the threshold, the semiconductor device 100 enters the "on" state, allowing current to flow through the channel region. In addition to acting as a switch, modulating the gate voltage can enable the gate region 122 to control the current flowing through the channel region, resulting in amplified output signals.

In an embodiment, the gate region 122 can enable the implementation of Boolean logic operations, such as AND, OR, and NOT, by controlling the flow of current based on the input voltages. Multiple semiconductor devices can be interconnected to form complex logic circuits, enabling the execution of various computational tasks in digital systems. In some embodiments, the gate region 122, along with other semiconductor device components, can facilitate the miniaturization and integration of electronic circuits. The ability to control the channel region's conductivity through the gate voltage allows for compact and highly efficient circuit designs.

The first set of nanosheets 118 includes 3D structures where the channel region of the top nanosheet FET 112 is surrounded by multiple stacked nanosheets. The first set of nanosheets 118 serves as the conducting channels within the top nanosheet FET 112, and the gate structure controls the flow of current through these sheets.

Similarly, the second set of nanosheets 128 includes 3D structures, where the channel region of the bottom nanosheet FET 120 is surrounded by multiple stacked nanosheets. The second set of nanosheets 128 serves as the conducting channels within the bottom nanosheet FET 120, and the gate structure controls the flow of current through these sheets.

The ILD 130 can be a layer of insulating material to electrically isolate and provide mechanical support between different layers of conducting and active components. The ILD 130 can enable efficient signal transmission, reduce crosstalk, and ensure the proper functioning of the semiconductor device 100. In an embodiment, the ILD 130 can electrically isolate adjacent conducting layers or active components in the semiconductor device 100. By providing insulation between different layers, the ILD 130 can prevent electrical shorts, reduce (e.g., minimize) leakage current, and ensure that signals are directed only along the desired pathways. In some embodiments, the ILD 130 can help reduce parasitic capacitance between adjacent metal interconnects or active devices and provide mechanical support to the semiconductor device's structure.

The MDI 132 can electrically isolate individual components in the semiconductor device 100, and provide electrical isolation between each of the nanosheet FETs in the logic device 110A. That is, the MDI 132 can ensure that the operation of one component does not interfere with the operation of the others. By using a dielectric layer, which is an insulating layer that does not conduct electricity, the MDI 132 effectively prevents electrical crosstalk between the transistors and allows each one to operate independently. Further, by electrically isolating each transistor from the other, the MDI 132 can reduce the potential for crosstalk, which is the unwanted transfer of signals between circuit elements, thereby improving the overall performance of the semiconductor device 100.

By isolating each transistor, MDI 132 helps to prevent the failure of one transistor from affecting the others. This can improve the overall reliability of the device. Additionally, the MDI 132 allows for more flexibility in device design, as it allows each transistor in the stack to be accessed and controlled independently. This can be beneficial in a variety of applications where specific transistors may need to be activated or deactivated based on certain conditions. In some embodiments, the MDI 132 can help decrease the parasitic capacitance associated with the transistor, which can lead to faster switching times and improved performance.

In some embodiments, the placeholder 126B can be epitaxially grown. The use of the placeholder 126B can provide more flexibility in the fabrication process, allowing for the creation of complex geometries or the integration of different types of materials.

The vertically stacked epitaxial layers of the first material 140A and the second material 140B of the passive device 110B include alternating layers of silicon and silicon/germanium. In some embodiments, a silicon layer 142 is formed within the vertically stacked epitaxial layers of the first material 140A and the second material 140B and divides it into a top section and a bottom section. In an embodiment, the top section and the bottom section have substantially the same height. In some embodiments, the passive device 110B is separated from the vertically stacked epitaxial layers via the silicon layer 142.

The BILD 136 can be an insulating material or layer used to isolate and provide electrical insulation between the semiconductor device's active regions and the BSCA 126A, and to prevent unwanted electrical contact between the active regions and the backside contact, ensuring the proper functioning and integrity of the semiconductor device 100. In various embodiments, the BILD 136 can function as a protective layer, shielding the active regions of the semiconductor device 100 from external contaminants, moisture, and mechanical stress. The BILD 136 can further help prevent physical damage, such as scratches or particle contamination, which could adversely affect semiconductor device performance. Additionally, the BILD 136 can function as a barrier against moisture ingress, which can cause corrosion and degradation of the semiconductor device's components. In some embodiments, the BM1 134A is formed to cover the BSCA 126A and the BILD 136. The BM1 134A can connect the semiconductor device 100 to other devices. In some embodiments, the backside of the passive device 110B and the backside of the vertically stacked FET, i.e., the logic device 110A, are directly in contact with the BM1 134 via the BILD 136.

The BEOL 138 includes metal interconnects, e.g., wires and metal lines, and insulating layers that connect the various components of the semiconductor device 100 and enable them to function as a cohesive unit.

The N-type section 144A includes an N-type semiconductor region with a high concentration of electrons. In other words, the N-type section 144A includes a region where the majority of charge carriers are electrons. In some embodiments, in order to increase the electron density, a large number of donor impurities, e.g., phosphorus or arsenic, are added to the region, which turns the region into an N+ region.

The P-type section 144B includes a P-type semiconductor region with a high concentration of holes. In some embodiments, in order to create the P-type section 144B, a high concentration of acceptor impurities, e.g., boron or aluminum, is introduced into the semiconductor material.

In an embodiment, the passive device 110B includes a P/N junction. The electrons from the P-type section 144B tend to migrate across the junction into the N-type section 144A, and the holes from the P-type section 144B tend to migrate into the N-type section 144A. The migration of charge carriers across the P/N junction results in the creation of a built-in electric field that opposes further movement of charge carriers across the junction. This electric field sets up a depletion region (or space charge region) near the junction, which is essentially devoid of free charge carriers. In some embodiments, when a voltage is applied to the P/N junction with the P-side more positive (higher potential) than the N-side, it reduces the built-in electric field and narrows the depletion region, i.e., forward bias, which allows current to flow across the junction. In some embodiments, when a voltage is applied in the opposite direction, with the P-side more negative than the N-side, it increases the built-in electric field, widening the depletion region, i.e., reverse bias, which prevents the flow of current across the junction.

In some embodiments, the passive device 110B is a diode, which allows current to flow in one direction (forward bias) while blocking it in the other direction (reverse bias). In such embodiments, the passive device 110B can be a two-terminal device that primarily functions as a one-way valve for electrical current. The passive device 110B can convert alternating current (AC) into direct current (DC). To that end, when an AC voltage is applied to the passive device 110B, i.e., the diode, the passive device 110B allows current to flow in one direction (during the positive half of the AC cycle) and blocks current in the opposite direction (during the negative half of the AC cycle), which results in the conversion of AC voltage into a unidirectional DC voltage. In an embodiment, the passive device 110B maintains a constant output voltage across its terminals, even when the input voltage varies. In some embodiments, the passive device 110B can be used to clip or limit the amplitude of a signal. For example, by connecting the passive device 110B in parallel with a signal source, the passive device 110B prevents the signal voltage from exceeding a certain level.

In some embodiments, the passive device 110B is a bipolar junction transistor (BJTs), which can be used for, without limitation, in amplification and switching. BJT is a three-layer semiconductor device that functions as an electronic switch or amplifier. While in some embodiments, the BJT is a Negative-Positive-Negative, NPN, device, in some embodiments, the BJT is a Positive-Negative-Positive, PNP, device. Each of the NPN and PNP can function as a switch, in which by controlling the current applied to the base terminal, they can control the larger current flowing from the collector to the emitter, effectively using the transistor as an electronic switch.

In some embodiments, the passive device 110B is used as an amplifier. In such embodiments, in the amplification mode (active region), a small input current or voltage is applied at the base terminal to control a larger current flow between the collector and emitter.

In some embodiments, the passive device's configuration is a common emitter (NPN) or common base (PNP) configuration. In such a configuration, the input is applied to the base terminal, and the output is taken from the collector terminal, which provides voltage gain. Alternatively, in some embodiments, the passive device's configuration is a common collector (NPN) or common emitter (PNP) configuration. In such a configuration, the input is applied to the base terminal, and the output is taken from the emitter terminal, which provides current gain and is sometimes called an emitter follower.

Example Processes for Semiconductor Device with Co-Integrated Passive Devices and Nanosheet FETs With the foregoing description of an example semiconductor device, it may be helpful to discuss an example process of manufacturing the same. To that end, FIGS. 2-19 illustrate various acts in the manufacture of a semiconductor device, consistent with illustrative embodiments. Figures denoted by A, illustrate an X section of the semiconductor device, and figures denoted by B, illustrate a Y section of the semiconductor device. It is also worth mentioning that the semiconductor device 100 depicted in FIG. 1 can be the same as the semiconductor device depicted in FIGS. 2-19. For ease of illustration, the fabrication operations depicted therein will be described in the context of forming stacked transistors. The stacked transistors are fabricated to include a bottom transistor and a top transistor. The bottom transistor is fabricated to include a bottom source/drain region, and the top transistor is fabricated to include a top source/drain region.

Figure 2A:
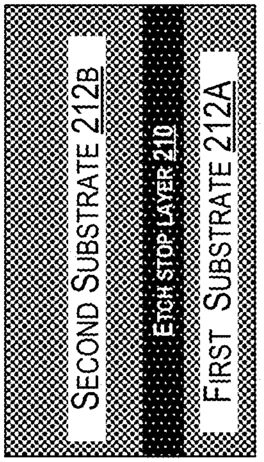
FIGS. 2A-2B illustrate side-views of a semiconductor device after the formation of the silicon substrate and silicon/silicon-germanium stack, in accordance with some embodiments.
Figure 2B:
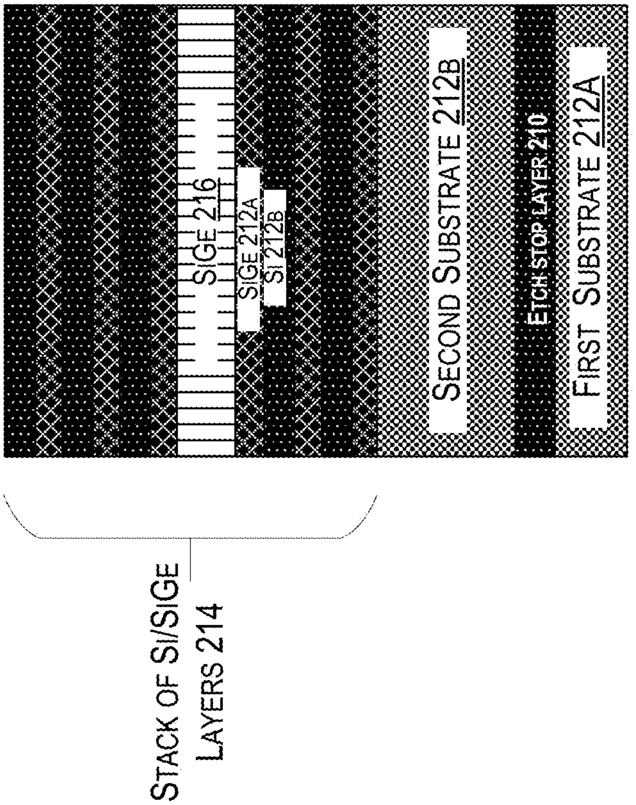

Referring now is made to FIGS. 2A-2B, which illustrates a semiconductor device after the formation of the silicon substrate and silicon/silicon-germanium stack, Si/SiGe, in accordance with some embodiments. Once the formation of the silicon substrate and Si/SiGe stack is performed, the semiconductor can include an etch stop layer 210 between a first substrate 212*a* and a second substrate 212*b*, a stack of Si/SiGe layers 214, and a high-Ge SiGe layer 216.

In the illustrative example depicted in FIGS. 2A-2B, the semiconductor device is depicted as being on silicon as the first substrate 212*a* and the second substrate 212*b*, while it will be understood that other types as substrates may be used as well, including, without limitation, monocrystalline Si, silicon germanium (SiGe), III-V compound semiconductor, II-VI compound semiconductor, or semiconductor-on-insulator (SOI). Group III-V compound semiconductors, for example, include materials having at least one group III element and at least one group V element, such as one or more of aluminum gallium arsenide (AlGaAs), aluminum gallium nitride (AlGaN), aluminum arsenide (AlAs), aluminum indium arsenide (AlIAs), aluminum nitride (AlN), gallium antimonide (GaSb), gallium aluminum antimonide (GaAlSb), gallium arsenide (GaAs), gallium arsenide antimonide (GaAsSb), gallium nitride (GaN), indium antimonide (InSb), indium arsenide (InAs), indium gallium arsenide (InGaAs), indium gallium arsenide phosphide (InGaAsP), indium gallium nitride (InGaN), indium nitride (InN), indium phosphide (InP) and alloy combinations including at least one of the foregoing materials. The alloy combinations can include binary (two elements, e.g., gallium (III) arsenide (GaAs)), ternary (three elements, e.g., InGaAs), and quaternary (four elements, e.g., aluminum gallium indium phosphide (AlInGaP)) alloys.

In various embodiments, the first substrate 210A and the second substrate 210B may include any suitable material or combination of materials, such as doped or undoped silicon, glass, dielectrics, etc. For example, the substrate may include a silicon-on-insulator (SOI) structure, e.g., with a buried insulator layer, or a bulk material substrate, e.g., with appropriately doped regions, typically referred to as wells. In another embodiment, the substrate may be silicon with silicon oxide, nitride, or any other insulating film on top.

In various embodiments, the etch stop layer 210 is formed over the first substrate 212*a*. The etch stop layer 210 can be a thin layer of material incorporated into the structure of the semiconductor device to provide a selective barrier against etching processes, preventing further removal of underlying materials during fabrication. The etch stop layer 210 can enable precise control over the etching depth and help define the desired device dimensions. The etch stop layer 210 can further provide a stopping point for the etching process, ensuring that specific layers or regions are not etched beyond a certain point, leading to accurate patterning and control of critical features. The etch stop layer 210 can create a distinct separation between different layers or components within the device structure, and prevent the undesired etching of underlying layers or materials, enabling the creation of complex, multi-layered structures with well-defined interfaces and boundaries. In some embodiments, the etch stop layer 210 acts as a protective barrier for sensitive or delicate materials to shield such materials from aggressive etchants, preventing damage or degradation during subsequent fabrication steps.

In some embodiments, prior to forming the etch stop layer 210, the first substrate 212*a* is prepared by cleaning and removing any impurities or oxide layers. The etch stop layer 210 is deposited onto the first substrate 212*a* using techniques such as chemical vapor deposition (CVD), physical vapor deposition (PVD), or atomic layer deposition (ALD). In an embodiment, a photoresist can be applied, exposed to a patterned mask, developed, and used as a protective layer to define the etch stop regions. The etch stop layer 210 can then be selectively etched, stopping at a predetermined depth, while protecting the underlying layers. After the etching process, the remaining photoresist can be removed through stripping techniques. While in some embodiments, SiGe is used to form the etch stop layer 210, in some embodiments, silicon nitride (SiN), silicon oxide (SiO2), or silicon oxynitride (SiON) can be used as the etch stop layer 210. In some embodiments, a second substrate 212*b* is epitaxially grown over the etch stop layer 210.

The high-Ge SiGe layer 216 can have a higher concentration of Ge compared to other SiGe layers. In an embodiment, the Ge content of the high-Ge SiGe 216 is about 55% Ge.

Figure 3A:
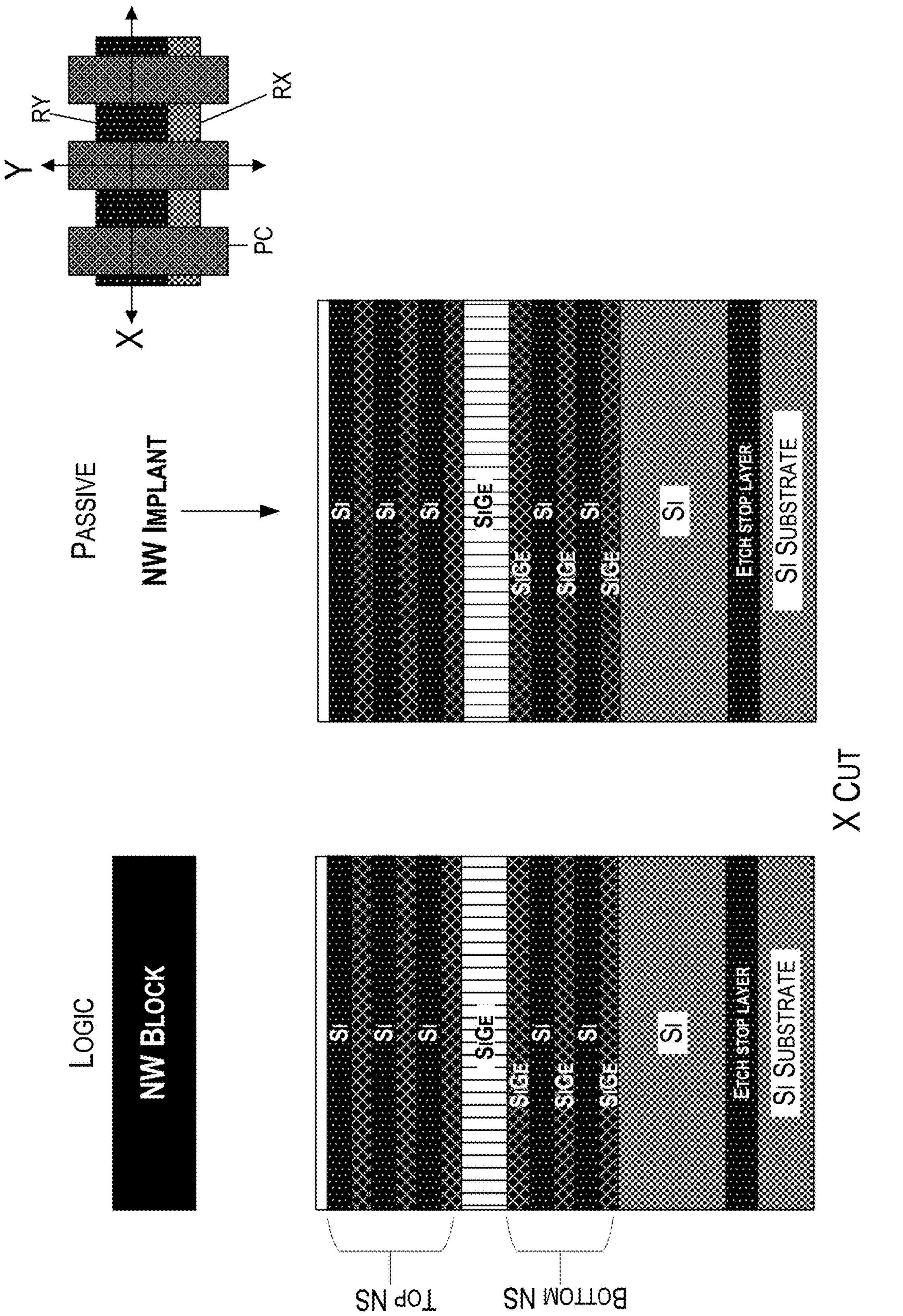
FIGS. 3A-3B illustrate side-views of a semiconductor device after implanting the N-type dopant, in accordance with some embodiments.
Figure 3B:
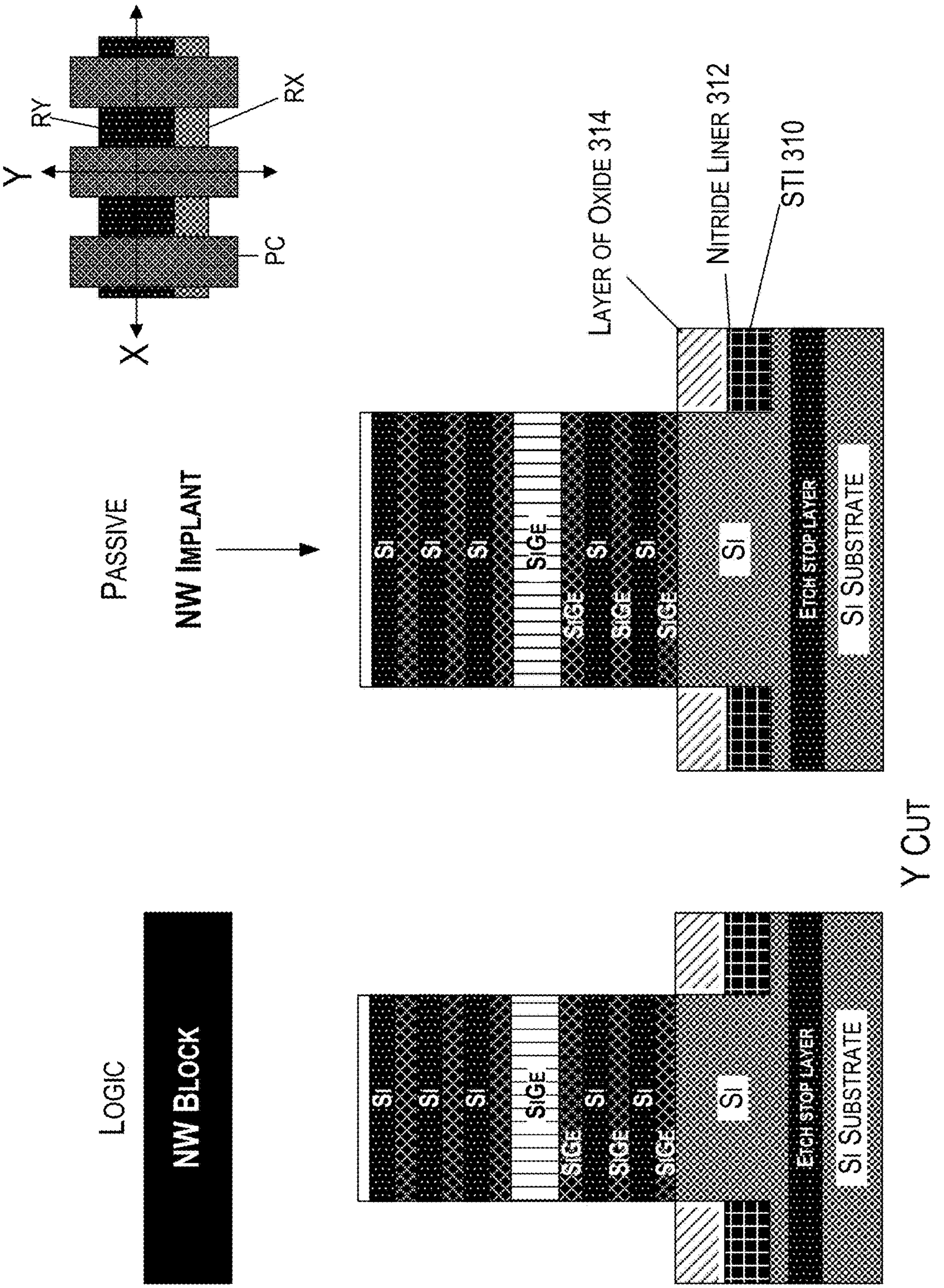

FIGS. 3A-3B illustrate the semiconductor device after implanting the N-type dopant, i.e., NW implantation, in accordance with some embodiments. In some embodiments, the NW implantation is performed on the passive device. The NW implantation is limited to the passive device, and the logic device is blocked by an NW block. Prior to NW implantation, a sacrificial layer is formed over the logic device and the passive device. As shown in the Y section illustrated in FIG. 3B, portions of the Si/SiGe stack are laterally recessed until some parts of the second substrate are removed. Shallow trench isolation, STI, 310 is formed over the recessed portions of the second substrate. A layer of nitride liner 312 is formed over the STI 310 and sidewalls of the second substrate. The remaining resected portions of the second substrate are filled with a layer of oxide 314, which is formed over the nitride liner 312.

Figure 4A:
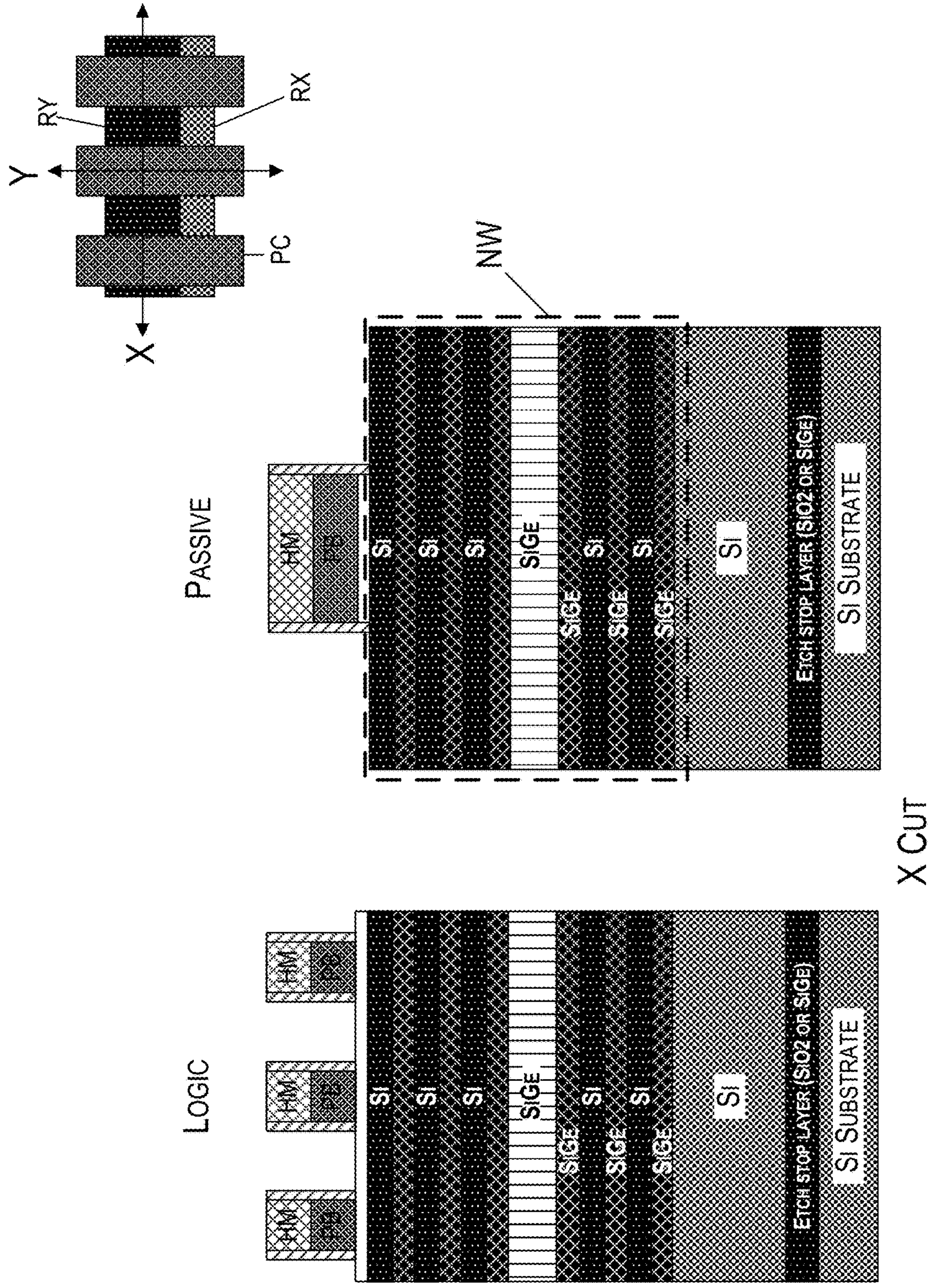
FIGS. 4A-4B illustrate side-views of a semiconductor device after the formation of the dummy gate, in accordance with some embodiments.
Figure 4B:
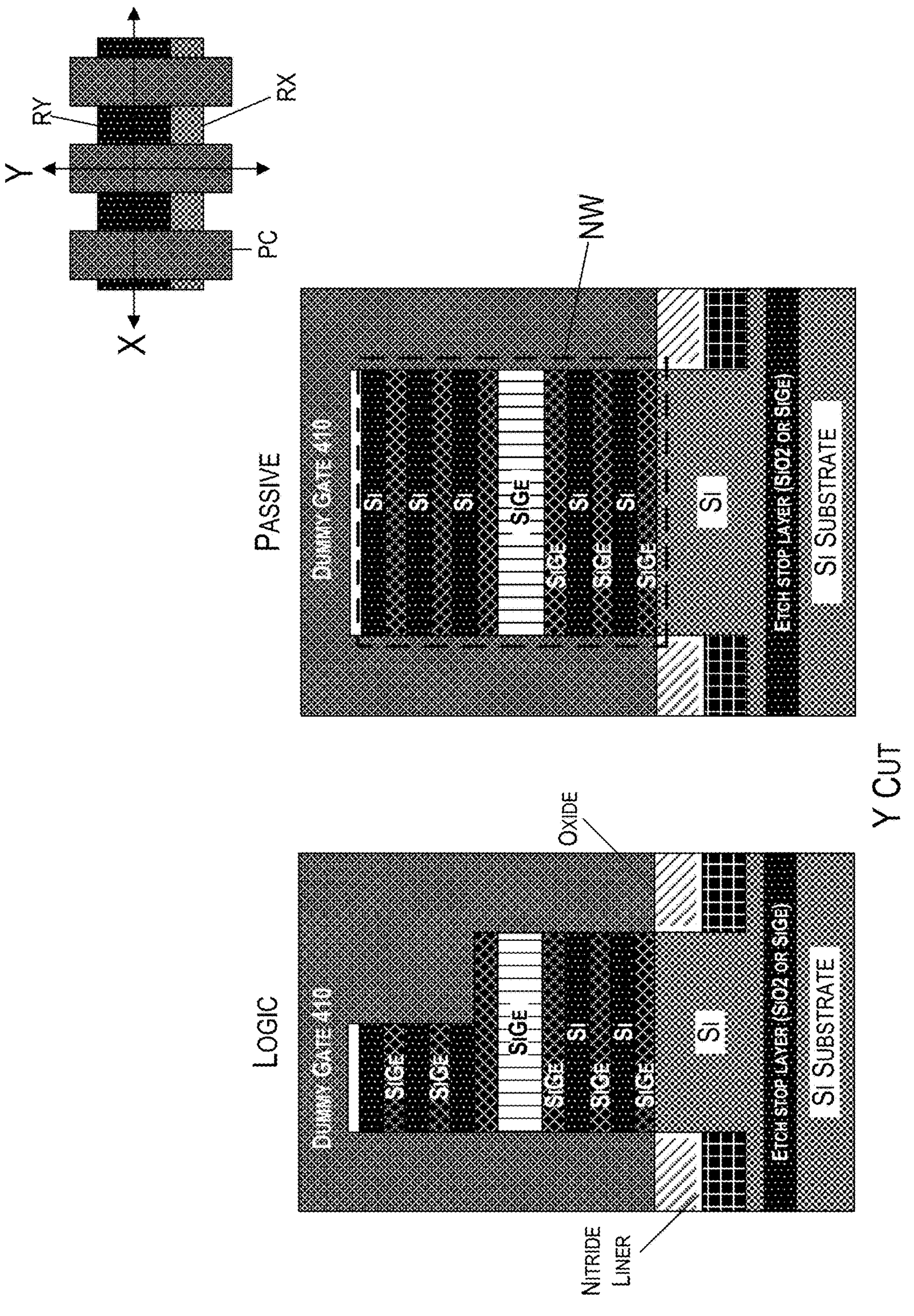

FIGS. 4A-4B illustrate the semiconductor device after the formation of the dummy gate, in accordance with some embodiments. In some embodiments, a dummy gate 410 is formed over the logic device and the passive device. The dummy gate 410 can cover the logic device and the passive device in the Y section shown in FIG. 4B.

Figure 5A:
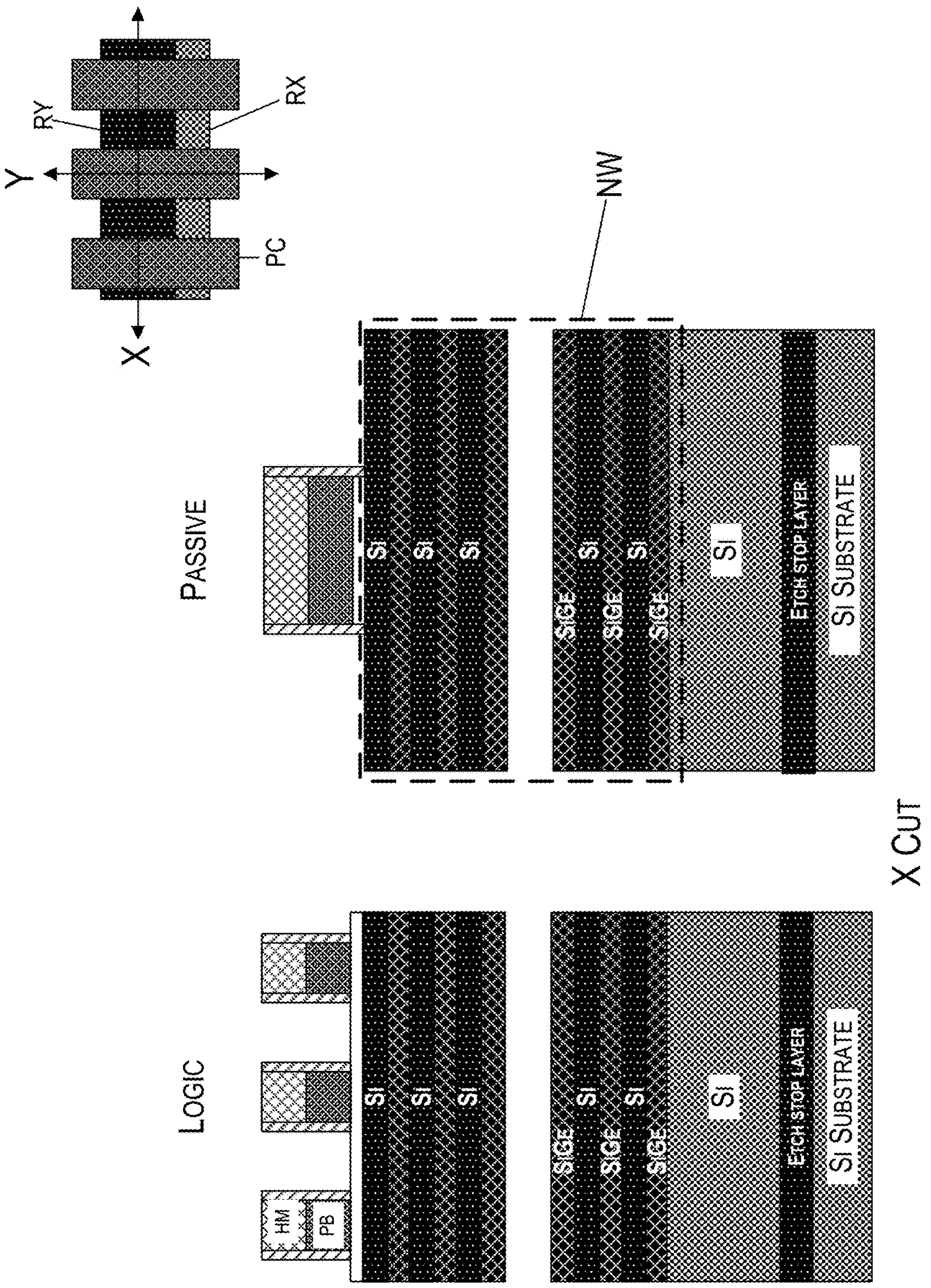
FIGS. 5A-5B illustrate side-views of a semiconductor device after the removal of the high-Ge SiGe layer, in accordance with some embodiments.
Figure 5B:
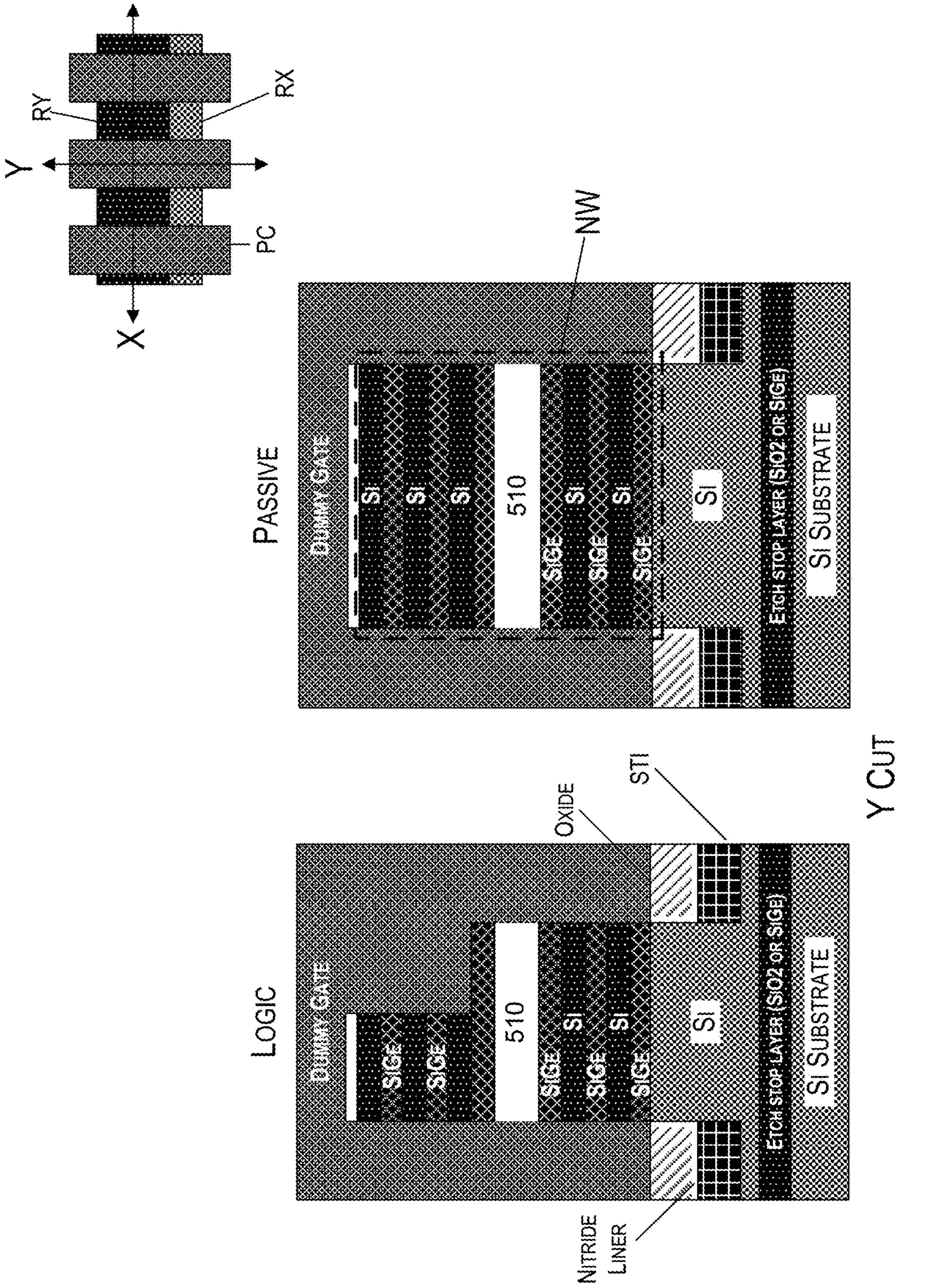

FIGS. 5A-5B illustrate the semiconductor device after the removal of the high-Ge SiGe layer, in accordance with some embodiments. In some embodiments, the high-Ge SiGe layer is removed to form two separate epitaxial stacks of Si and SiGe layers. The separate epitaxial stacks of Si and SiGe layers are used to form the top FET and the bottom FET.

Figure 6A:
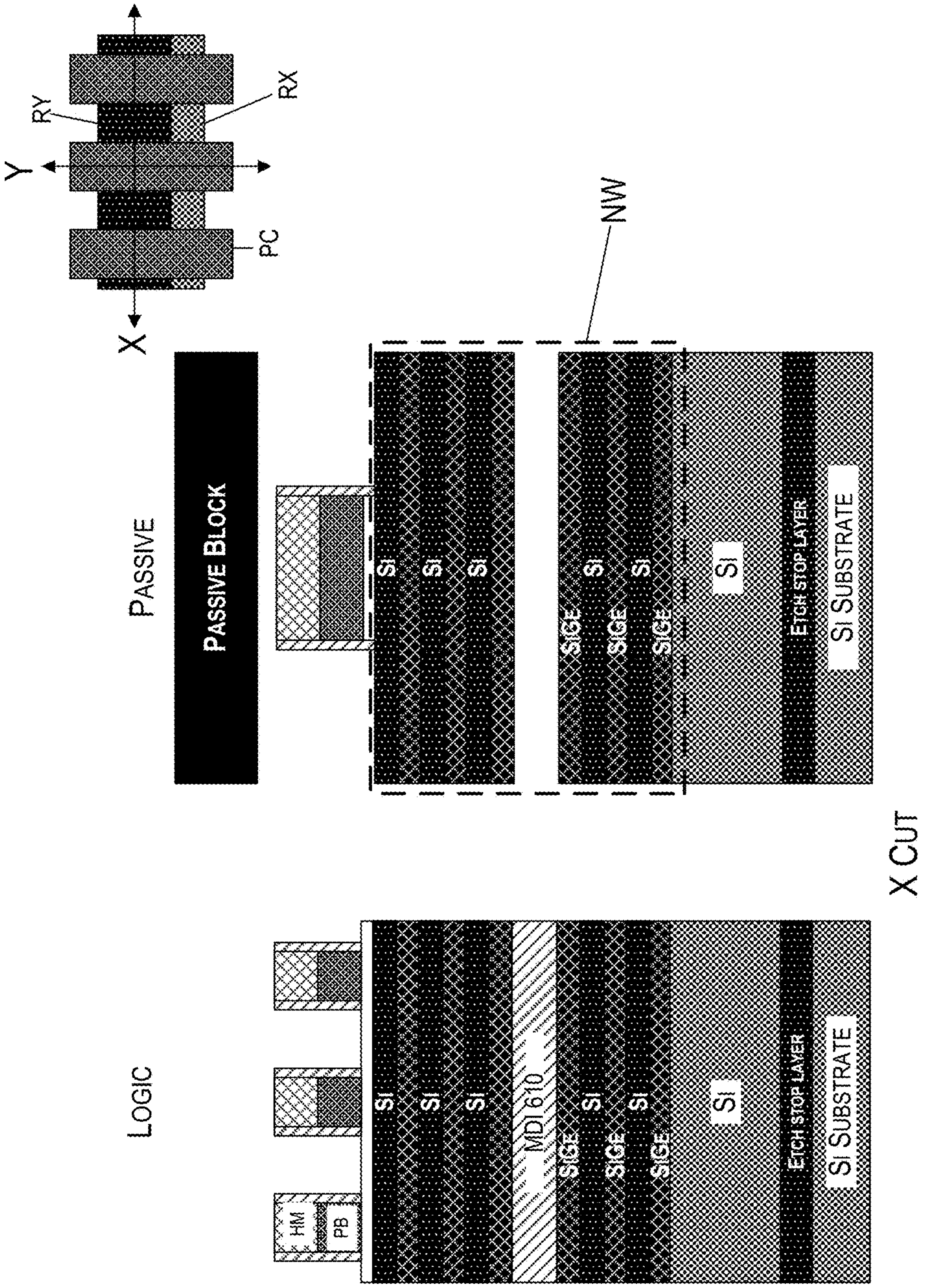
FIGS. 6A-6B illustrate side-views of a semiconductor device after the formation of the spacer and a middle dielectric interlayer (MDI), in accordance with some embodiments.
Figure 6B:
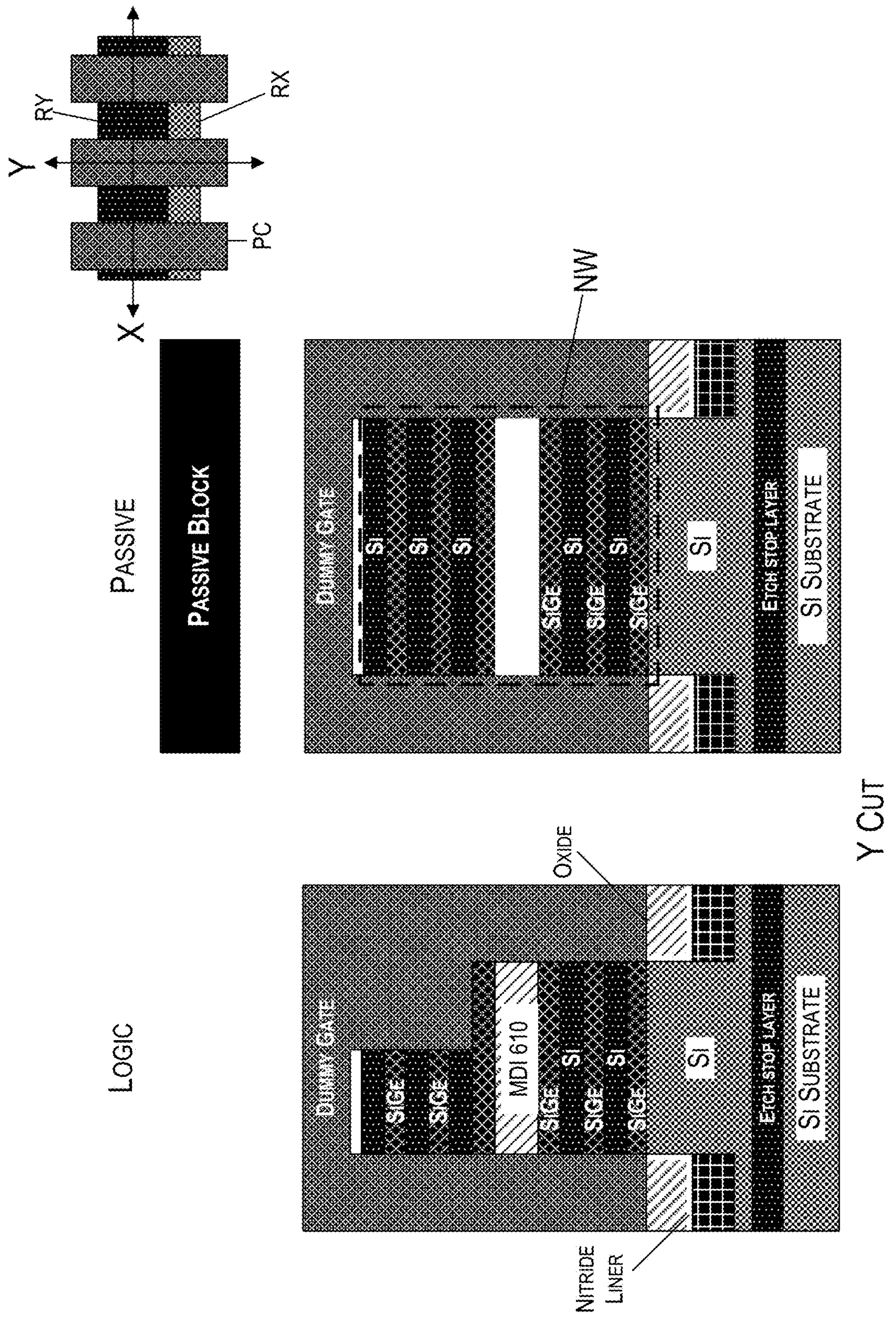

FIGS. 6A-6B illustrate the semiconductor device after the formation of the spacer and MDI, in accordance with some embodiments. In some embodiments, an MDI 610 is formed between the two separate epitaxial stacks of Si and SiGe layers in the logic device. In other words, the MDI 610 replaces the high-Ge SiGe layer in the logic device. Prior to the formation of the MDI 610, in order to preserve the passive device in this step, a passive block covers the passive device.

Figure 7A:
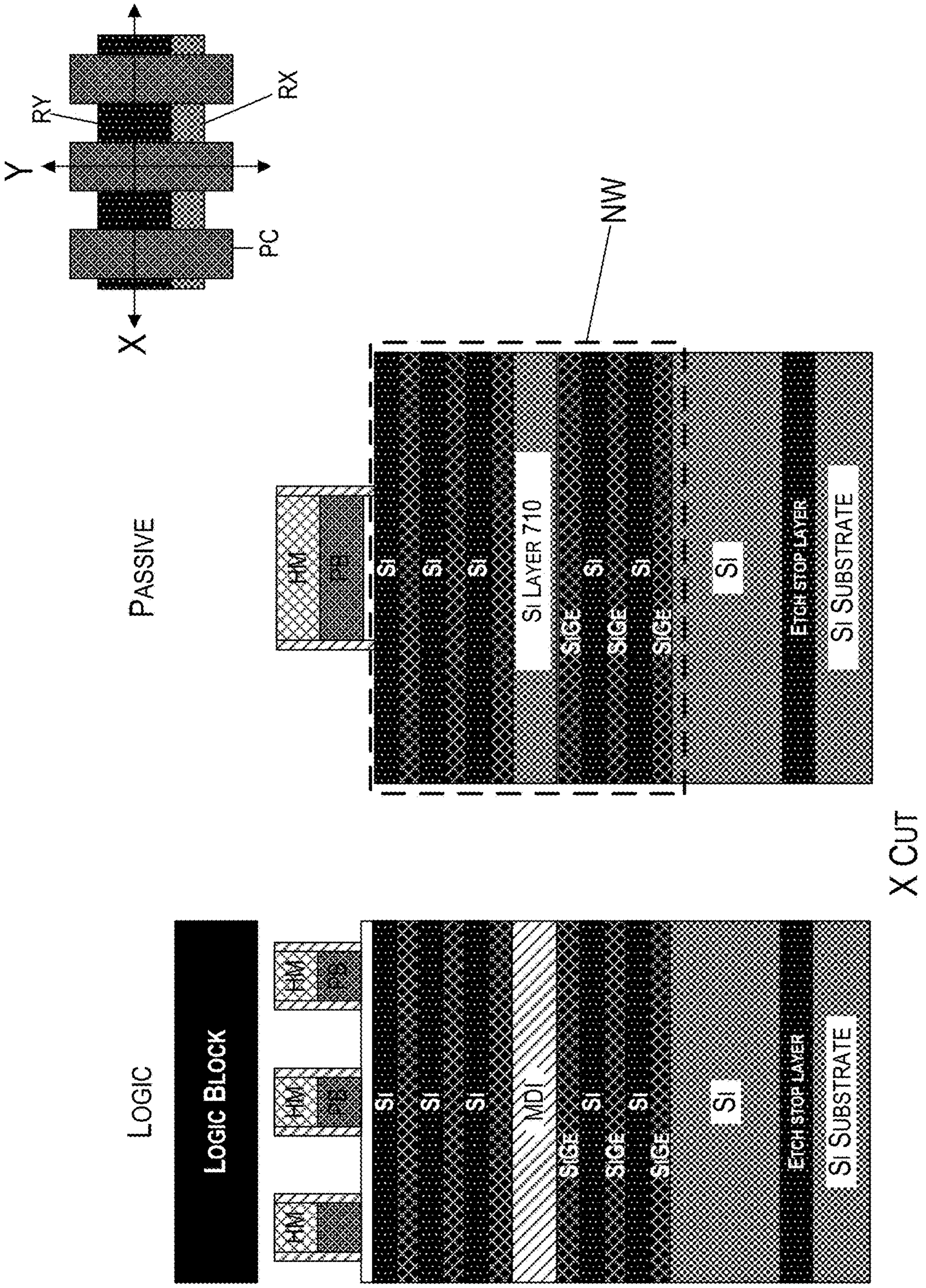
FIGS. 7A-7B illustrate side-views of a semiconductor device after the formation of the silicon layer, in accordance with some embodiments.
Figure 7B:
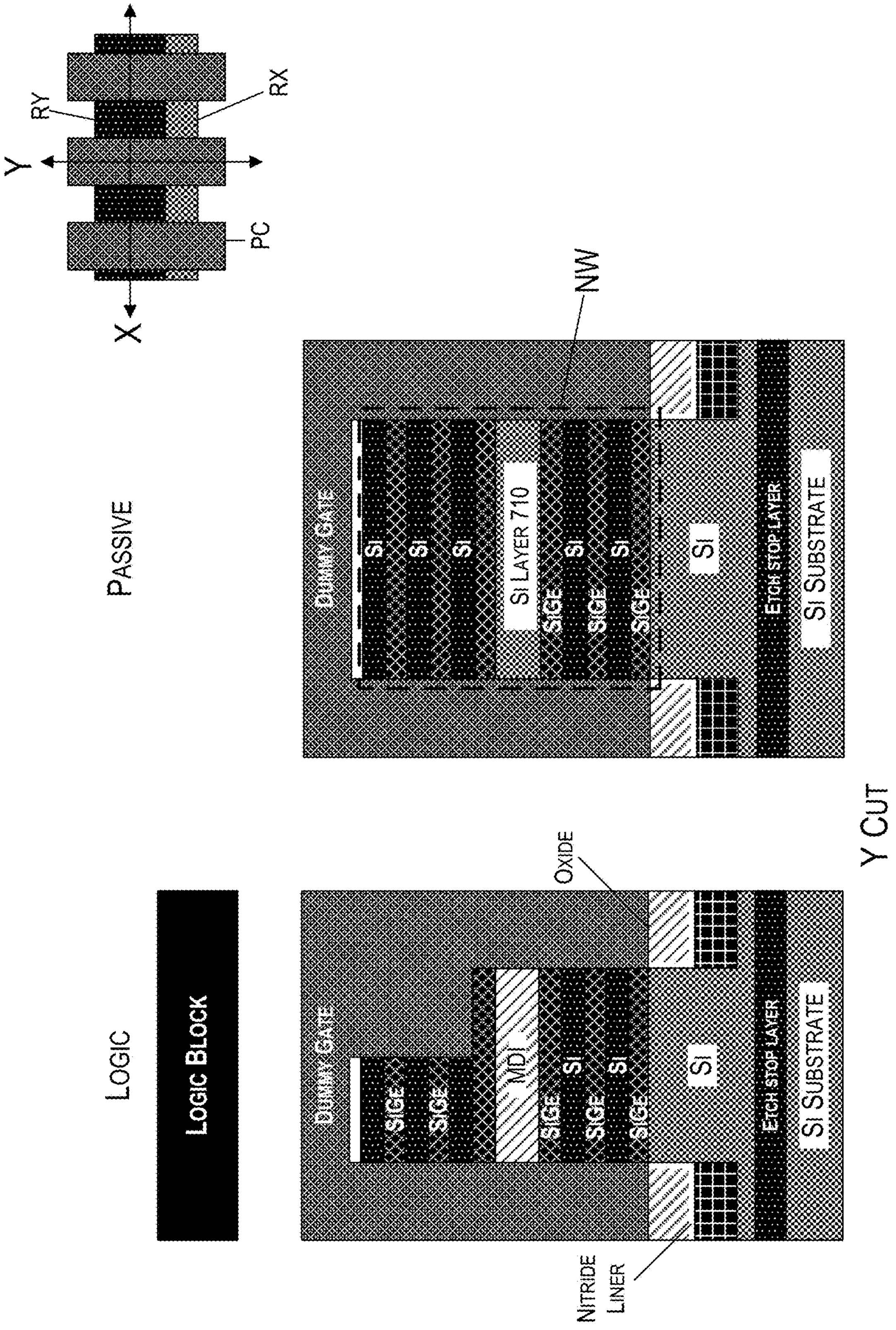

FIGS. 7A-7B illustrate the semiconductor device after the formation of the silicon layer, in accordance with some embodiments. In some embodiments, a silicon layer 710 is epitaxially grown between the two separate epitaxial stacks of Si and SiGe layers in the passive device. In other words, the silicon layer 710 replaces the high-Ge SiGe layer in the passive device. In some embodiments, the silicon layer 710 is N-doped. Prior to the formation of the silicon layer 710, in order to preserve the logic device in this step, a logic block covers the logic device.

Figure 8A:
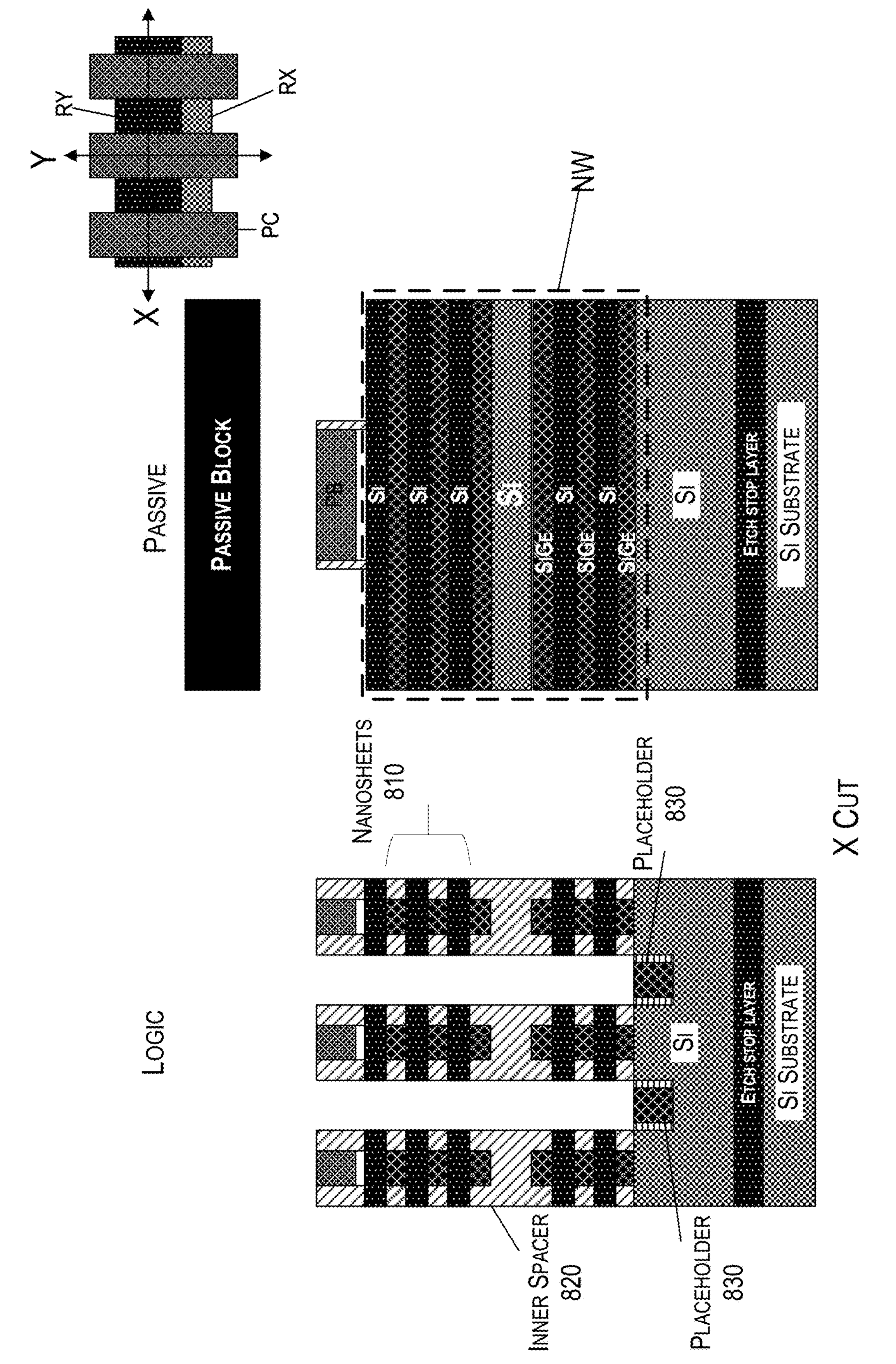
FIGS. 8A-8B illustrate side-views of a semiconductor device after the formation of the nanosheets and placeholder, in accordance with some embodiments.
Figure 8B:
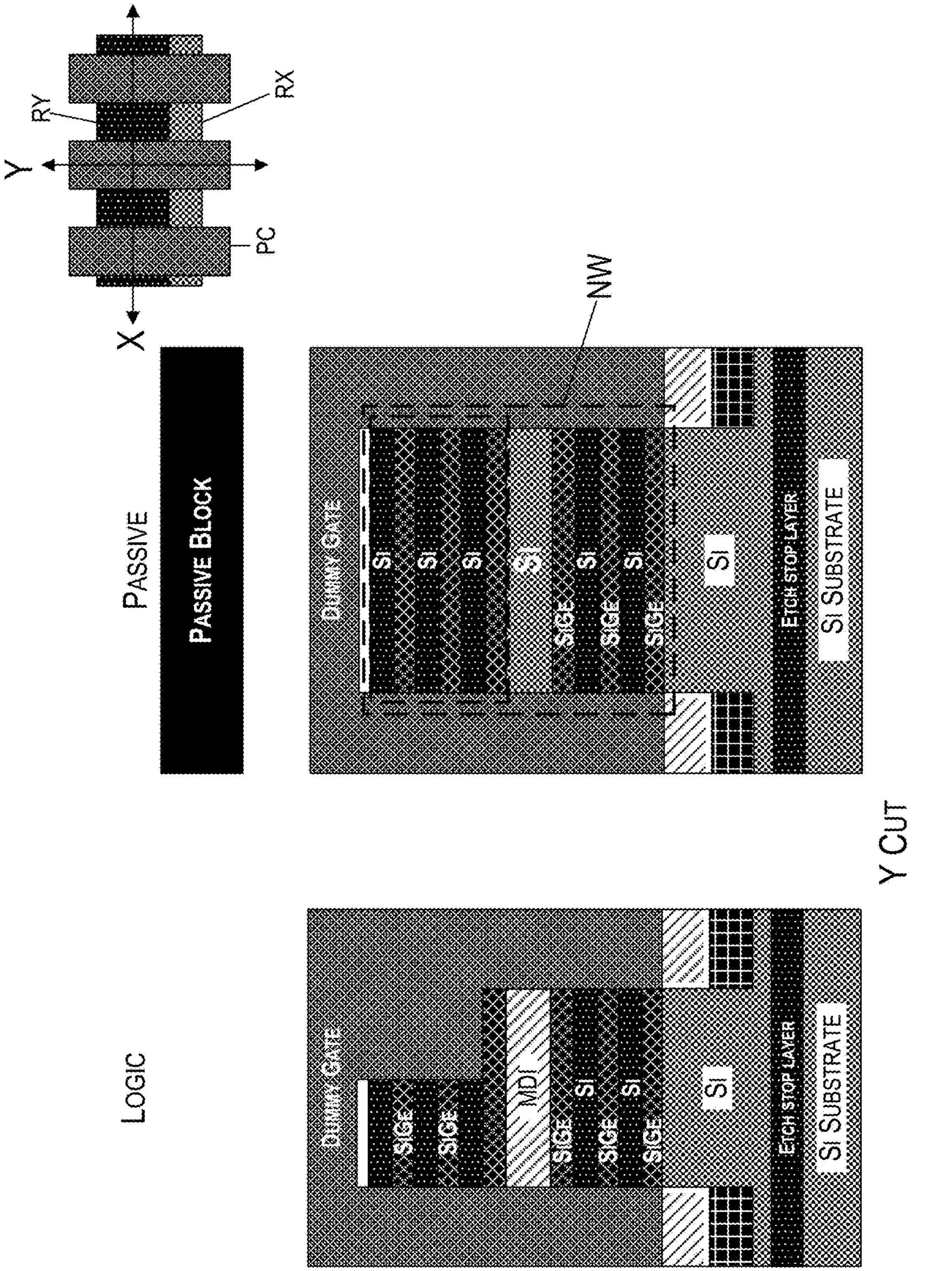

FIGS. 8A-8B illustrate the semiconductor device after the formation of the nanosheets and placeholder, in accordance with some embodiments. In some embodiments, the nanosheets 810 can be formed by removing the sacrificial layer and forming channel regions by laterally removing the Si and SiGe layers. The removal process can proceed until portions of the second substrate are removed. Portions of the sidewalls of the SiGe layers can be further indented and covered with the inner spacer 820. The inner spacer 820 can be formed by deposition techniques. Alternatively, the inner spacer 820 can be formed by etching or selectively epitaxially growing the inner spacer 820 over the sidewalls of the Si and SiGe layers.

The placeholders 830 can be formed within the removed portions of the second substrate and be used for direct backside contact formation. The portions of the second substrate can be removed by a reactive ion etching (RIE) technique. Generally, RIE is a dry etching process used in semiconductor device fabrication to remove materials from the surface of a substrate selectively. In some embodiments, RIE can involve the use of reactive ions and plasma to react with and remove specific materials chemically. In an embodiment, the RIE process begins by placing the semiconductor device inside a vacuum chamber. The chamber is then evacuated to create a low-pressure environment. Reactive gases, which can include a combination of a chemically reactive gas and an inert gas, are introduced into the chamber. The chemically reactive gas, such as fluorine-based gases (e.g., CF4, SF6) or chlorine-based gases (e.g., Cl2), can react with the material to be etched, i.e., the second substrate, Si, while the inert gas, e.g., argon, can help to control the ion bombardment.

In some embodiments, Radiofrequency or microwave power is applied to create a plasma within the chamber. In such embodiments, power excites the gas molecules, causing them to ionize and form a plasma of reactive ions and electrons. The plasma can include reactive ions that chemically react with the silicon. The reactive ions bombard the substrate surface, break chemical bonds and remove silicon. In various embodiments, the RIE process can be selective, meaning it can mainly affect the target material, i.e., silicon, while leaving other materials, such as masking layers or underlying layers, relatively unaffected.

In some embodiments, to achieve selective etching, an etch mask can be applied on the substrate surface prior to the RIE process. The etch mask protects certain regions from etching, allowing the reactive ions to remove the exposed material selectively. The etching process can be controlled to achieve specific etch profiles, such as vertical sidewalls or tapered structures. Parameters such as gas composition, pressure, power, and process duration are adjusted to achieve the desired etch characteristics. In some embodiments, endpoint detection techniques, such as optical emission spectroscopy or laser interferometry, can be used to determine when the etching process has reached a desired endpoint. This ensures accurate control of the etch depth and prevents over-etching. After the etching process is completed, the substrate can be cleaned to remove any residue or by-products from the etching. Cleaning can involve rinsing with solvents or plasma cleaning to ensure the substrate's surface is free from contaminants. Subsequently, the removed portions of the second substrate can be filled with the placeholders 830. The placeholders 830 can be epitaxially grown. Prior to the formation of the nanosheets 810 and placeholder 830, in order to preserve the passive device in this step, a passive block covers the passive device.

Figure 9A:
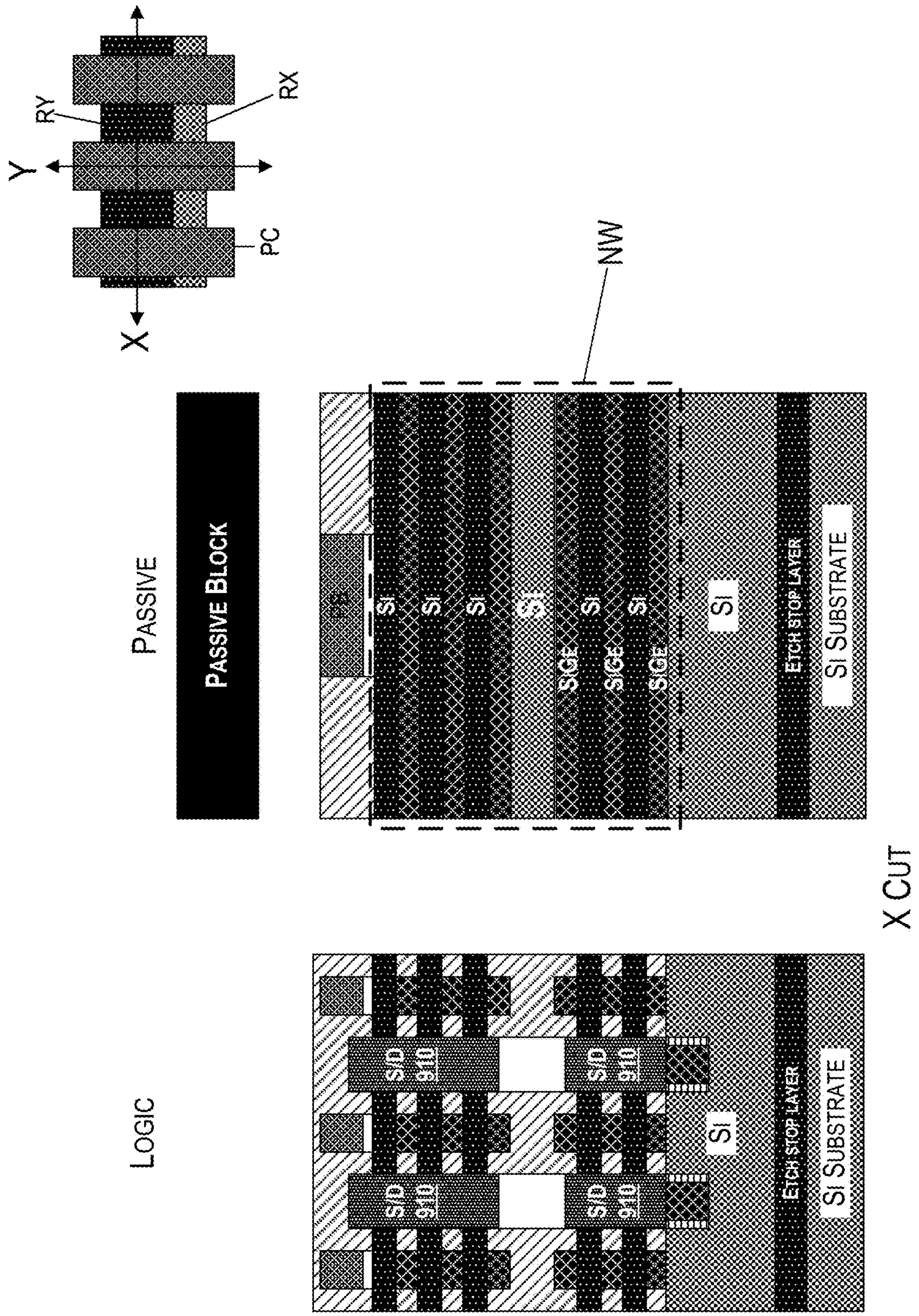
FIGS. 9A-9B illustrate side-views of a semiconductor device after the formation of the source/drain regions, in accordance with some embodiments.
Figure 9B:
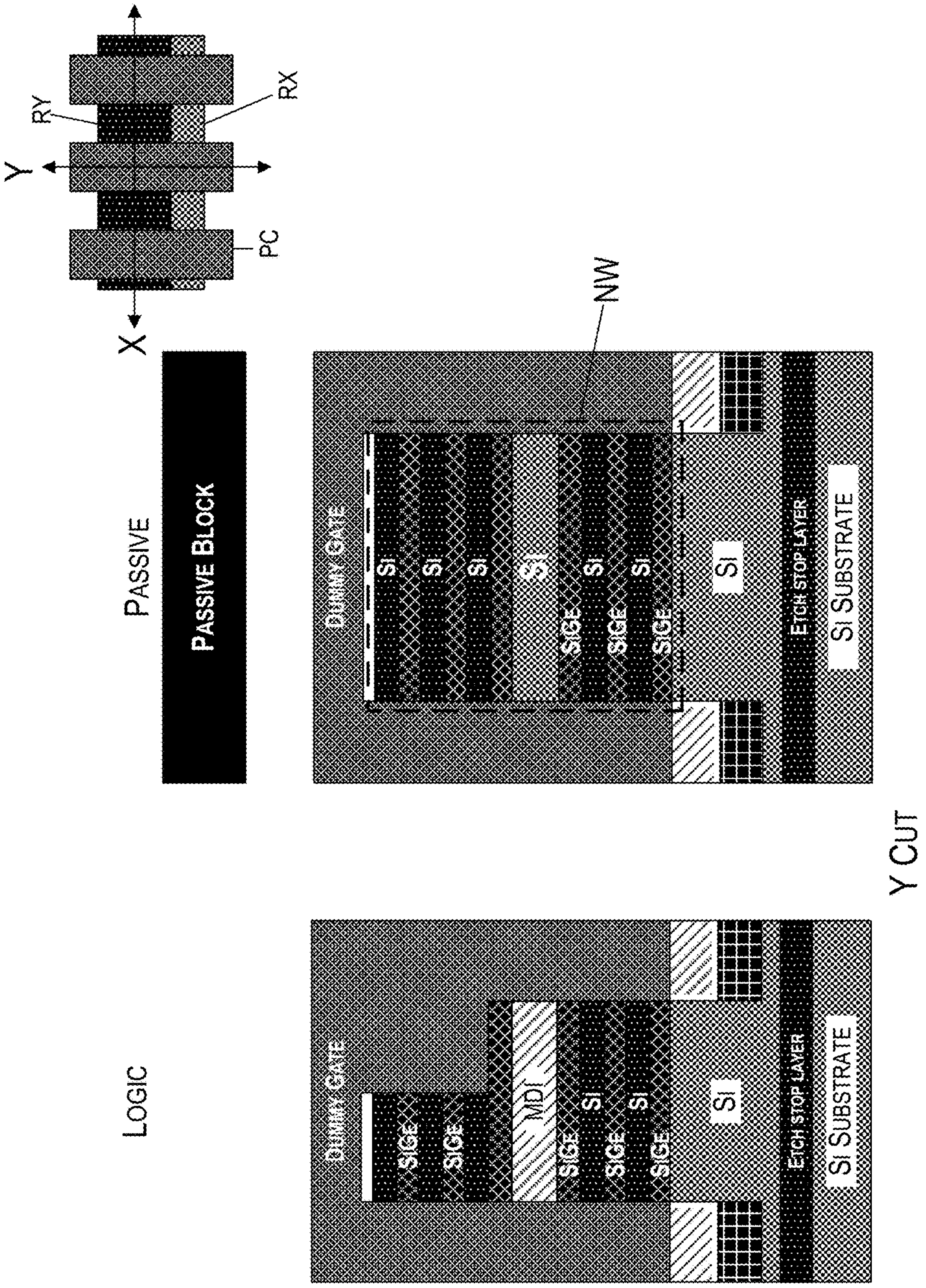

FIGS. 9A-9B illustrate the semiconductor device after the formation of the source/drain regions, in accordance with some embodiments. In some embodiments, the source/drain regions 910 are formed in the removed portions of the second substrate and above the placeholders. The source/drain regions of the top FET and the bottom FET are separated by a dummy metal layer 920. Prior to the formation of the source/drain regions 910, in order to preserve the passive device in this step, a passive block covers the passive device.

Figure 10A:
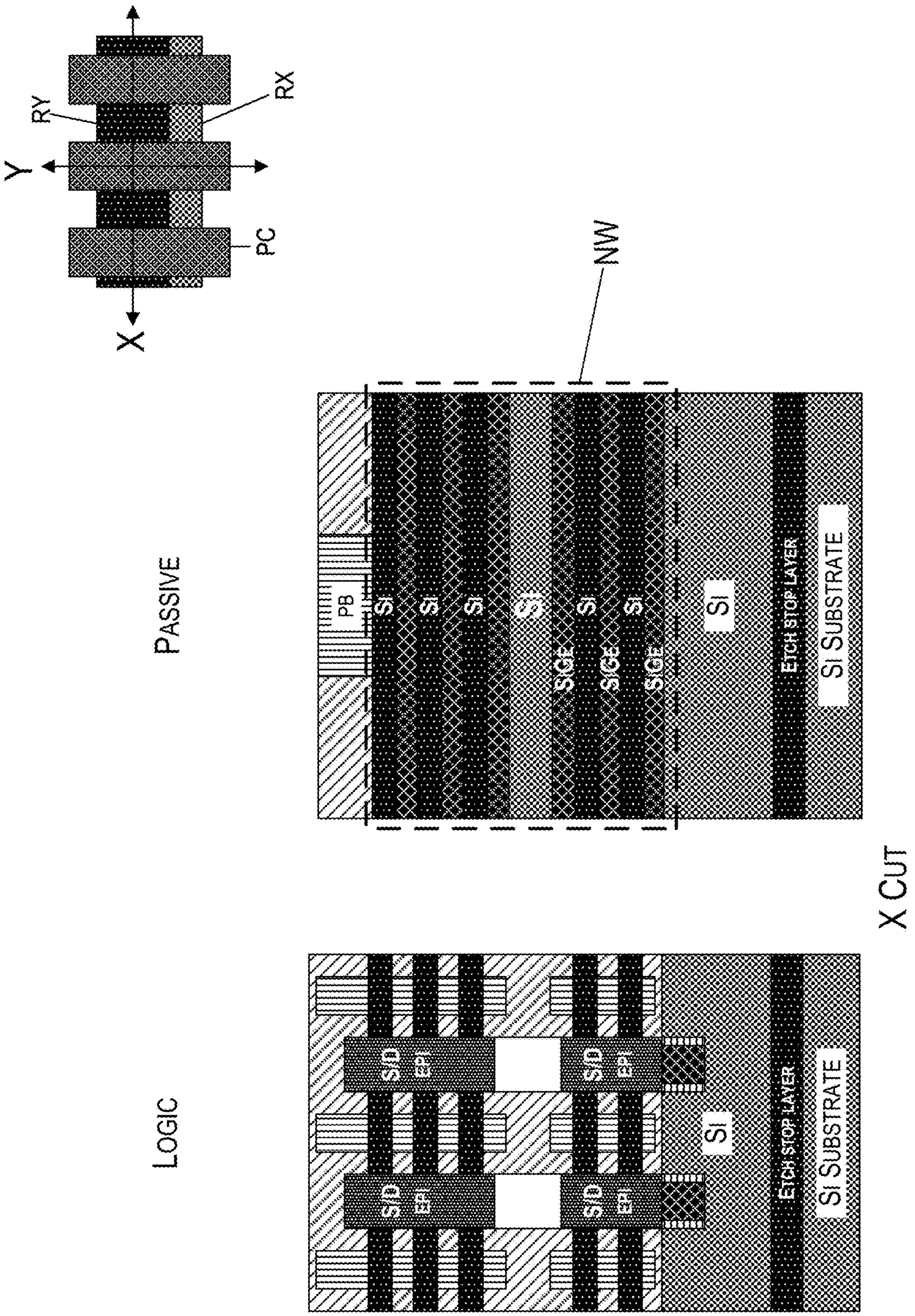
FIGS. 10A-10B illustrate side-views of a semiconductor device after the formation of the N-type section the work functions, in accordance with some embodiments.
Figure 10B:
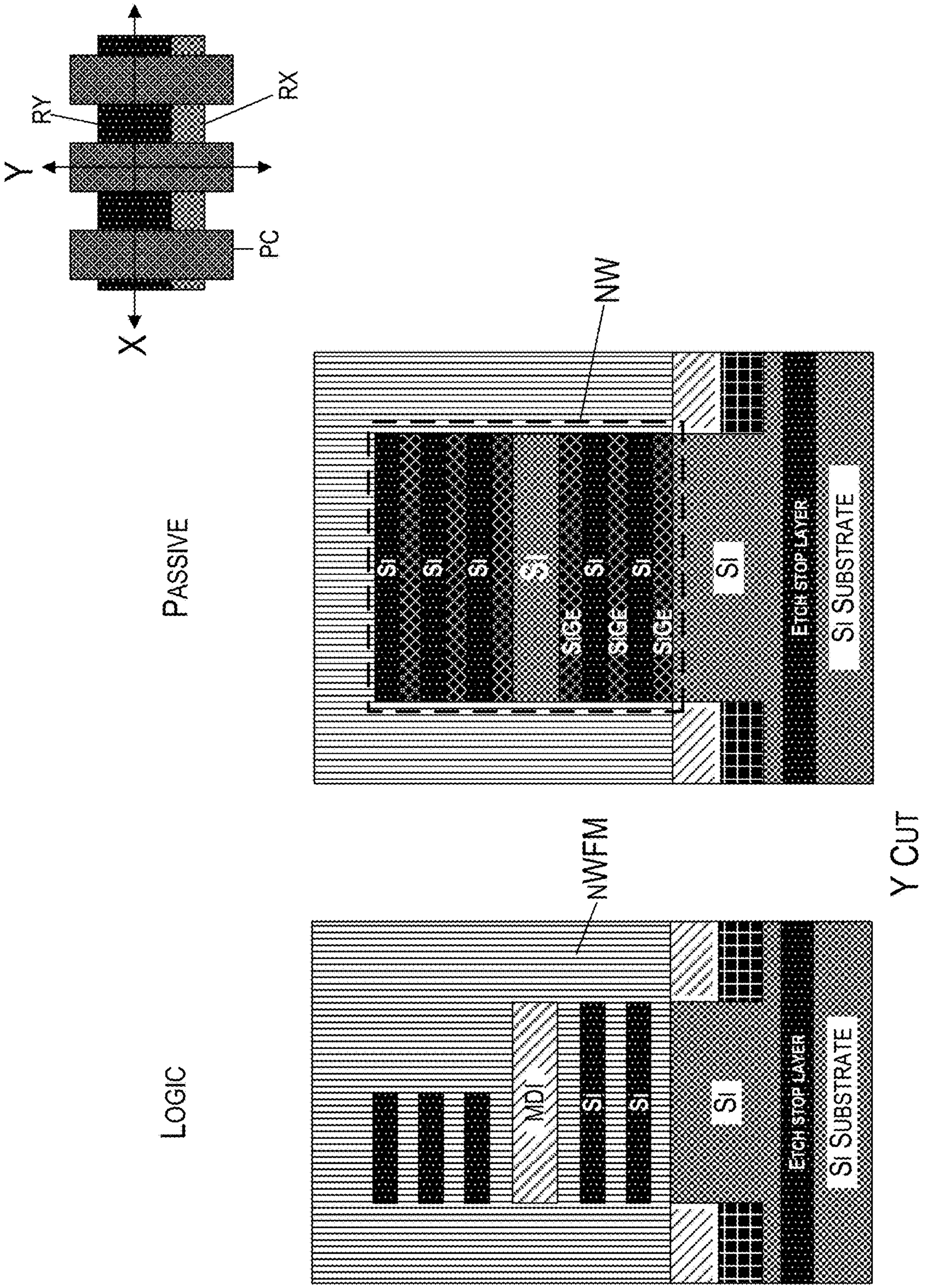

FIGS. 10A-10B illustrate the semiconductor device after the formation of the work functions, in accordance with some embodiments. In some embodiments, the sacrificial layer and dummy gate are removed. Metal gate materials with work functions that are appropriate for the desired threshold voltage and electron behavior in the N-type section of the passive device, i.e., nWFM, of the semiconductor device are formed. A replacement metal gate (RMG) process can be used to fabricate metal gate electrodes, form the contact for source/drain, and gate contact, and form the metal gate regions in the N-type section of the passive device. In some embodiments, RMG can involve the replacement of the SiGe with a metal material, which can offer improved electrical performance and scalability. The metal gates can provide electrostatic control of the channel region, reduce leakage currents, and improve the semiconductor device's performance. In some embodiments, the metal gates can further provide improved control over the work function, enable matching of threshold voltages, and reduce semiconductor device variability. The formation of the nWFM can be performed over the entire epitaxial stack.

Figure 11A:
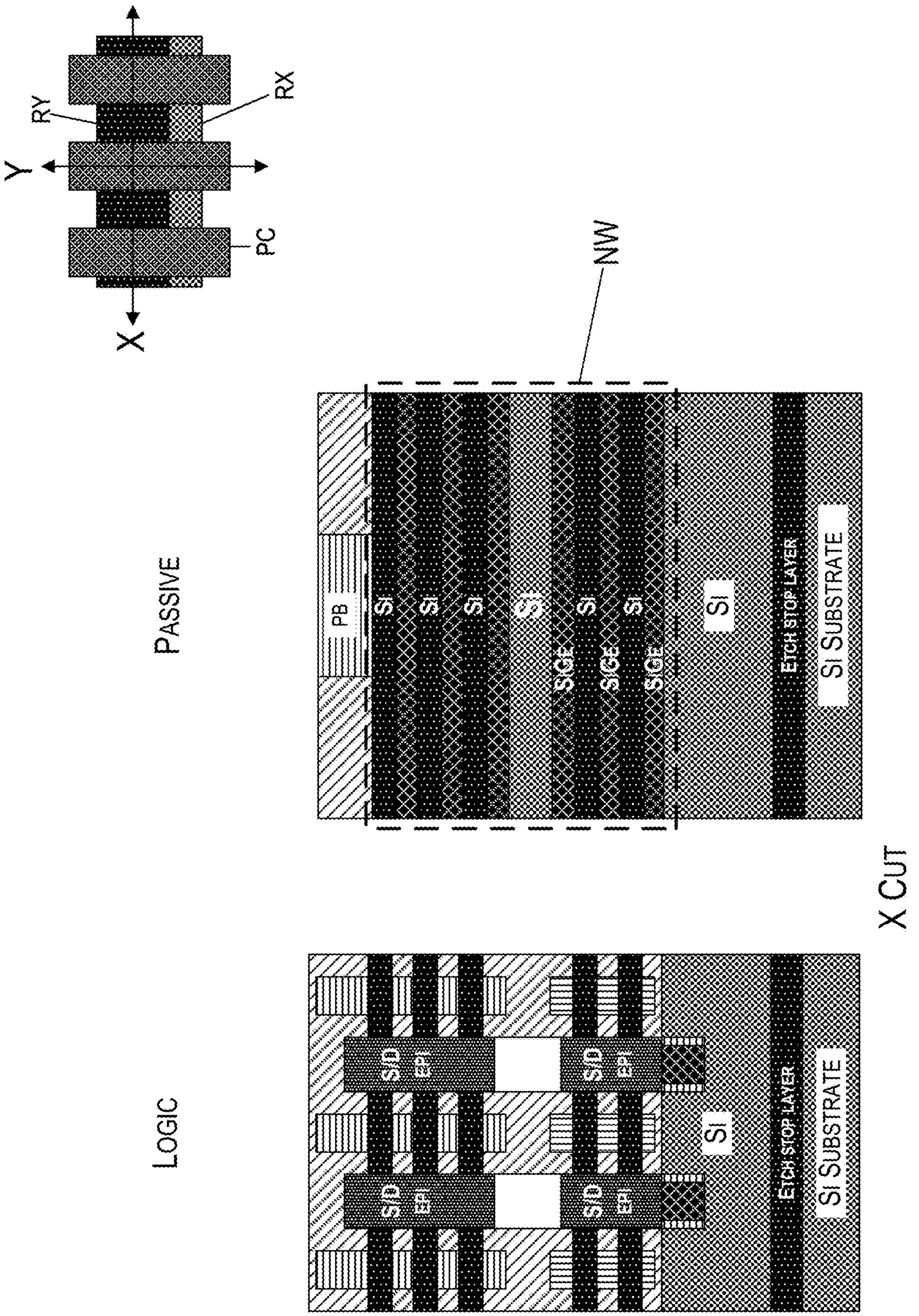
FIGS. 11A-11B illustrate side-views of a semiconductor device after the formation of the P-type section work functions, in accordance with some embodiments.
Figure 11B:
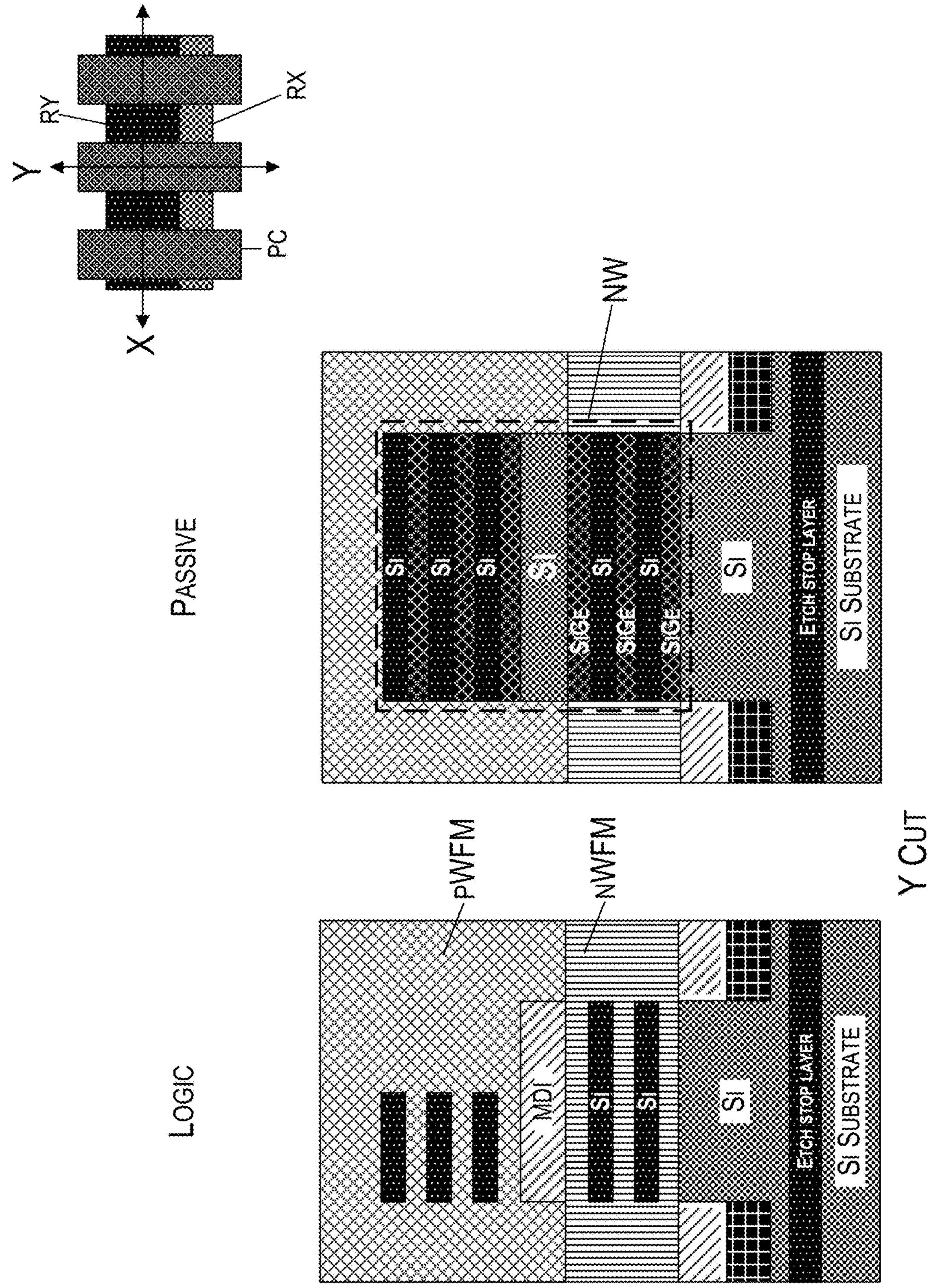

FIGS. 11A-11B illustrate the semiconductor device after the formation of the work functions, in accordance with some embodiments. In some embodiments, metal gate materials with work functions that are appropriate for the desired threshold voltage and electron behavior in the P-type section of the passive device, i.e., pWFM, of the semiconductor device are formed. Similar to the process described in FIGS. 10A-10B, an RMG process can be used to fabricate metal gate electrodes, form the contact for source/drain, and gate contact, and form the metal gate regions in the P-type section of the passive device. The formation of the pWFM can be performed over the top portion of the epitaxial stack.

Figure 12A:
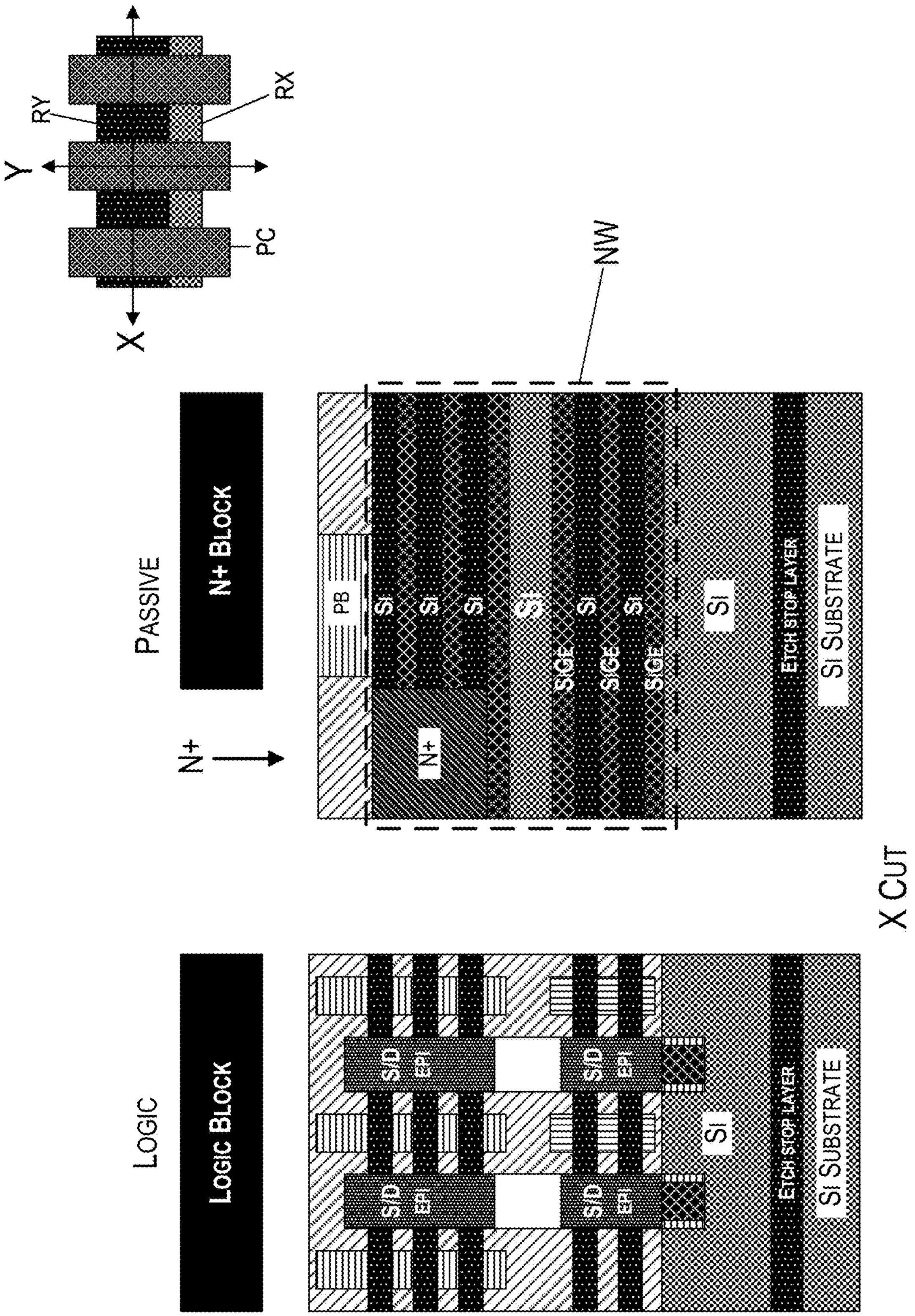
FIGS. 12A-12B illustrate side-views of a semiconductor device after the formation of the N-type section of the passive device, in accordance with some embodiments.
Figure 12B:
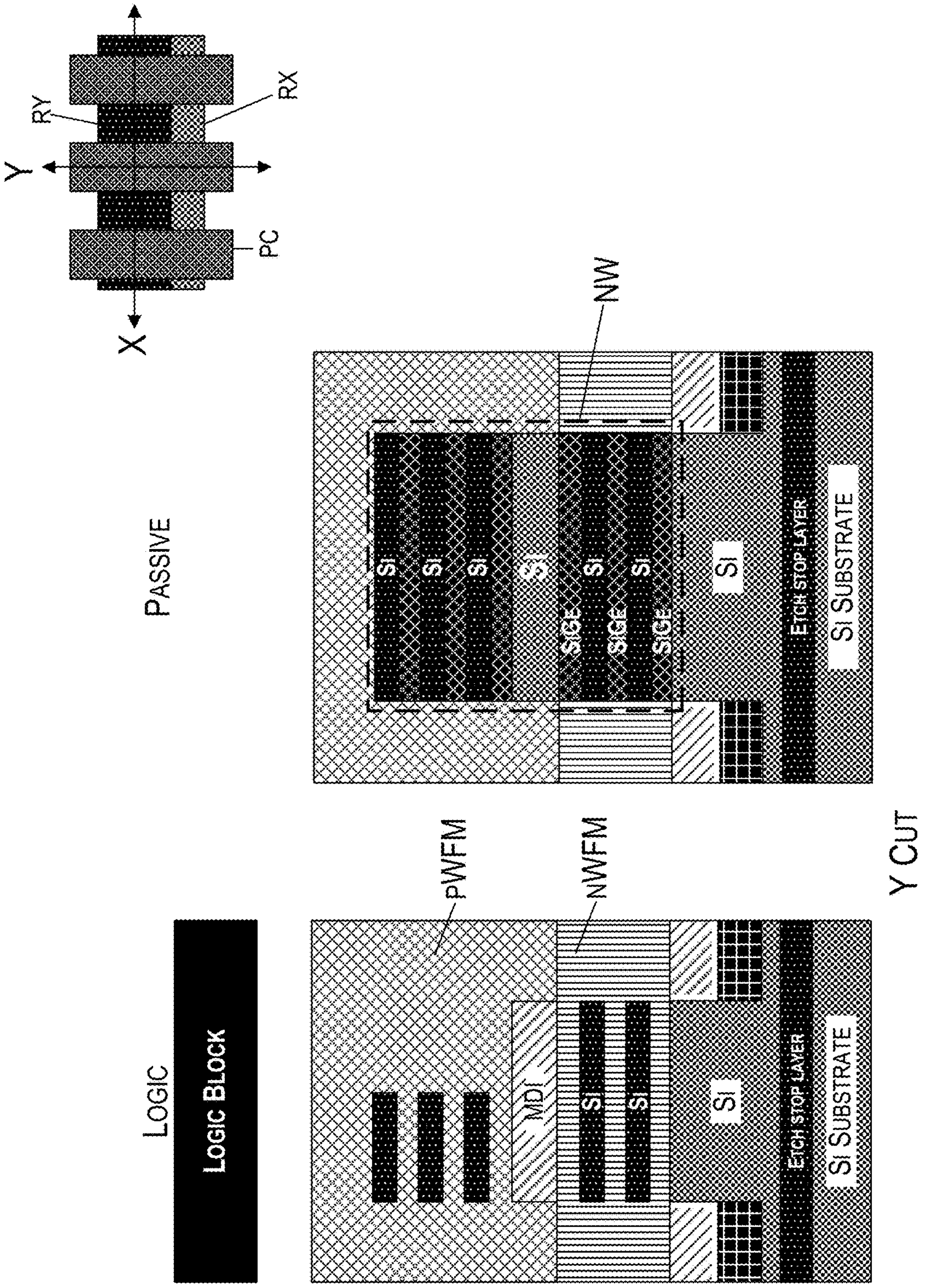

FIGS. 12A-12B illustrate the semiconductor device after the formation of the N-type section of the passive device, in accordance with some embodiments. In some embodiments, the N-type section of the passive device is doped with impurities to form the N-type section. In an embodiment, while only the N-type section is exposed, i.e., other sections of the passive device are covered by suitable blocks, the N-type section is exposed to a controlled atmosphere containing a specific dopant gas, such phosphorus. The dopants diffuse into the silicon lattice, creating the desired regions. Alternatively, in an embodiment, dopant ions are accelerated to high energies and implanted directly into the N-type section. Prior to the formation of the N-type section of the passive device, in order to preserve the logic device in this step, a logic block covers the logic device.

Figure 13A:
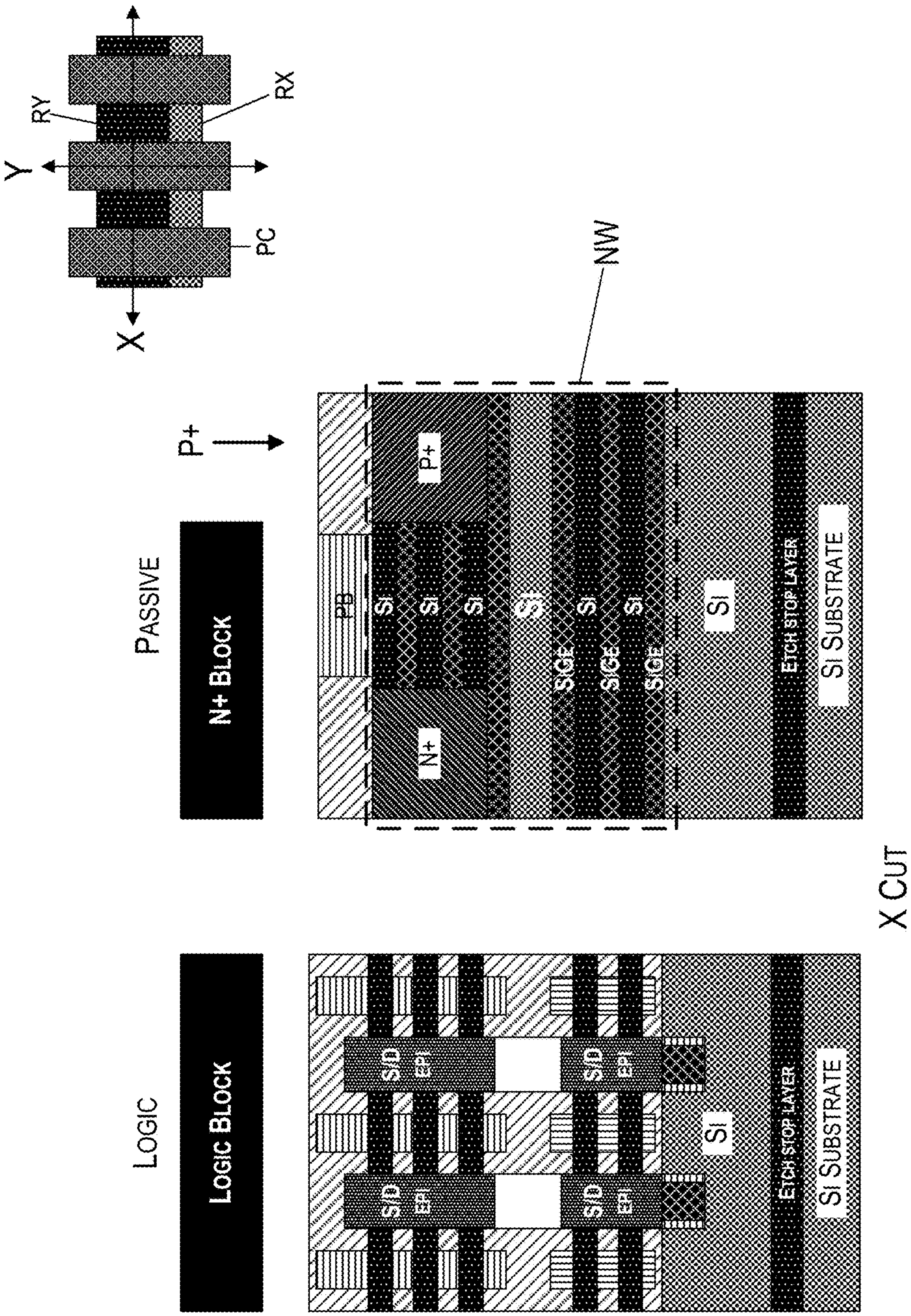
FIGS. 13A-13B illustrate side-views of a semiconductor device after the formation of the P-type section of the passive device, in accordance with some embodiments.
Figure 13B:
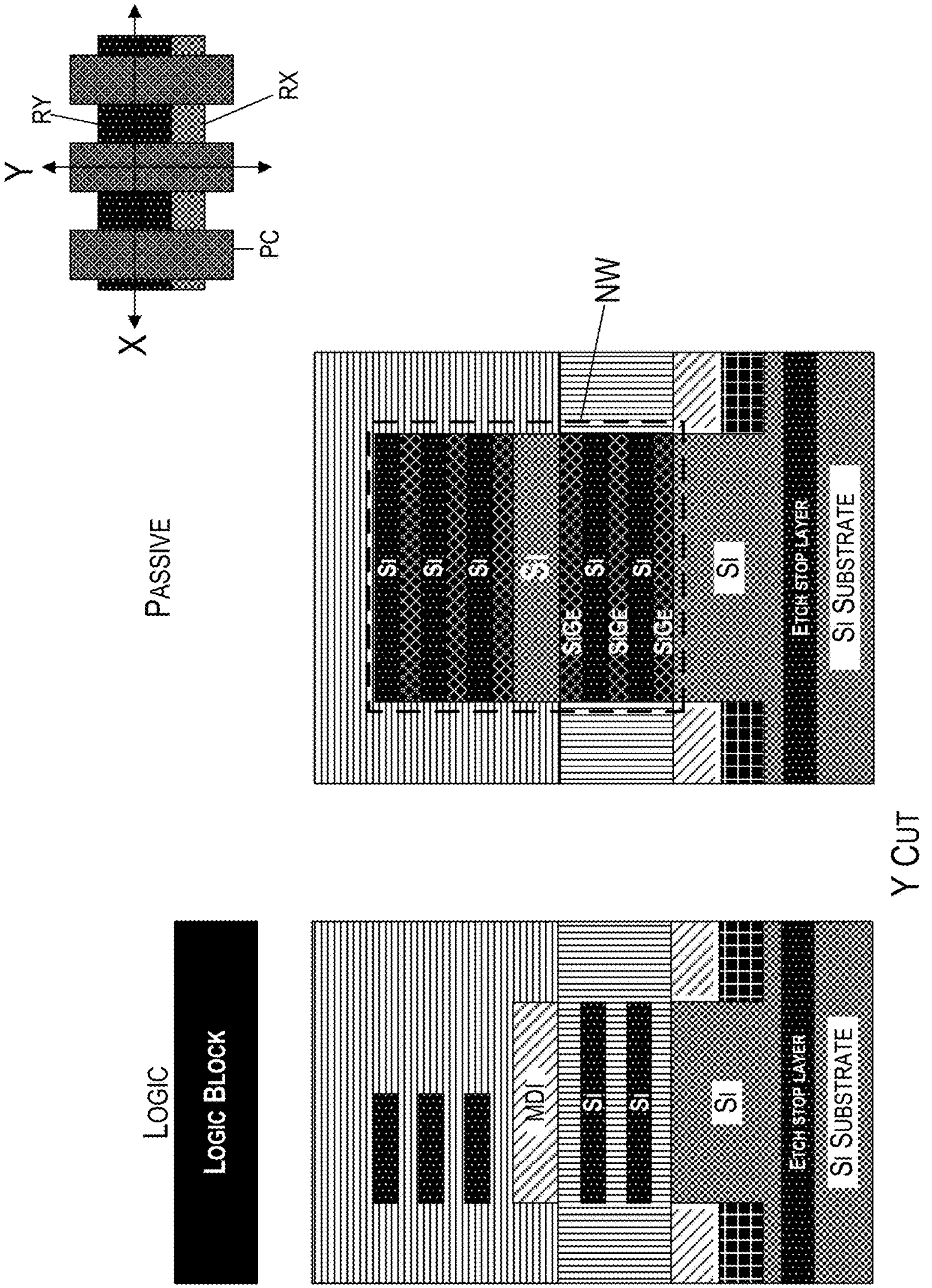

FIGS. 13A-13B illustrate the semiconductor device after the formation of the P-type section of the passive device, in accordance with some embodiments. In some embodiments, the P-type section of the passive device is doped with impurities to form the P-type section. In an embodiment, while only the P-type section is exposed, i.e., other sections of the passive device are covered by suitable blocks, the P-type section is exposed to a controlled atmosphere containing a specific dopant gas, such as Boron. The dopants diffuse into the silicon lattice, creating the desired regions. Alternatively, in an embodiment, dopant ions are accelerated to high energies and implanted directly into the P-type section. Prior to the formation of the P-type section of the passive device, in order to preserve the passive device in this step, a passive block covers the passive device.

Figure 14A:
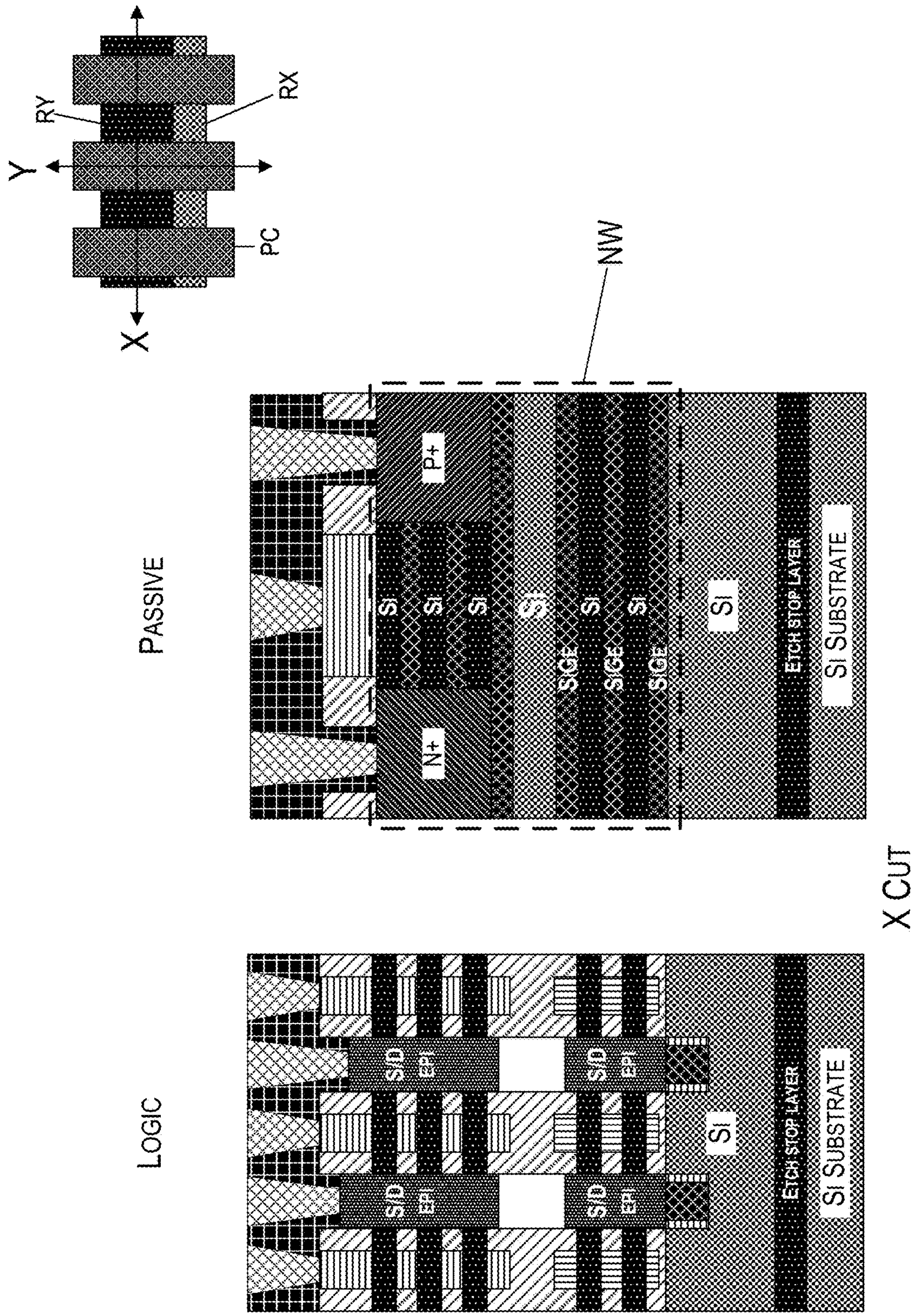
FIGS. 14A-14B illustrate side-views of a semiconductor device after the formation of the MOL, in accordance with some embodiments.
Figure 14B:
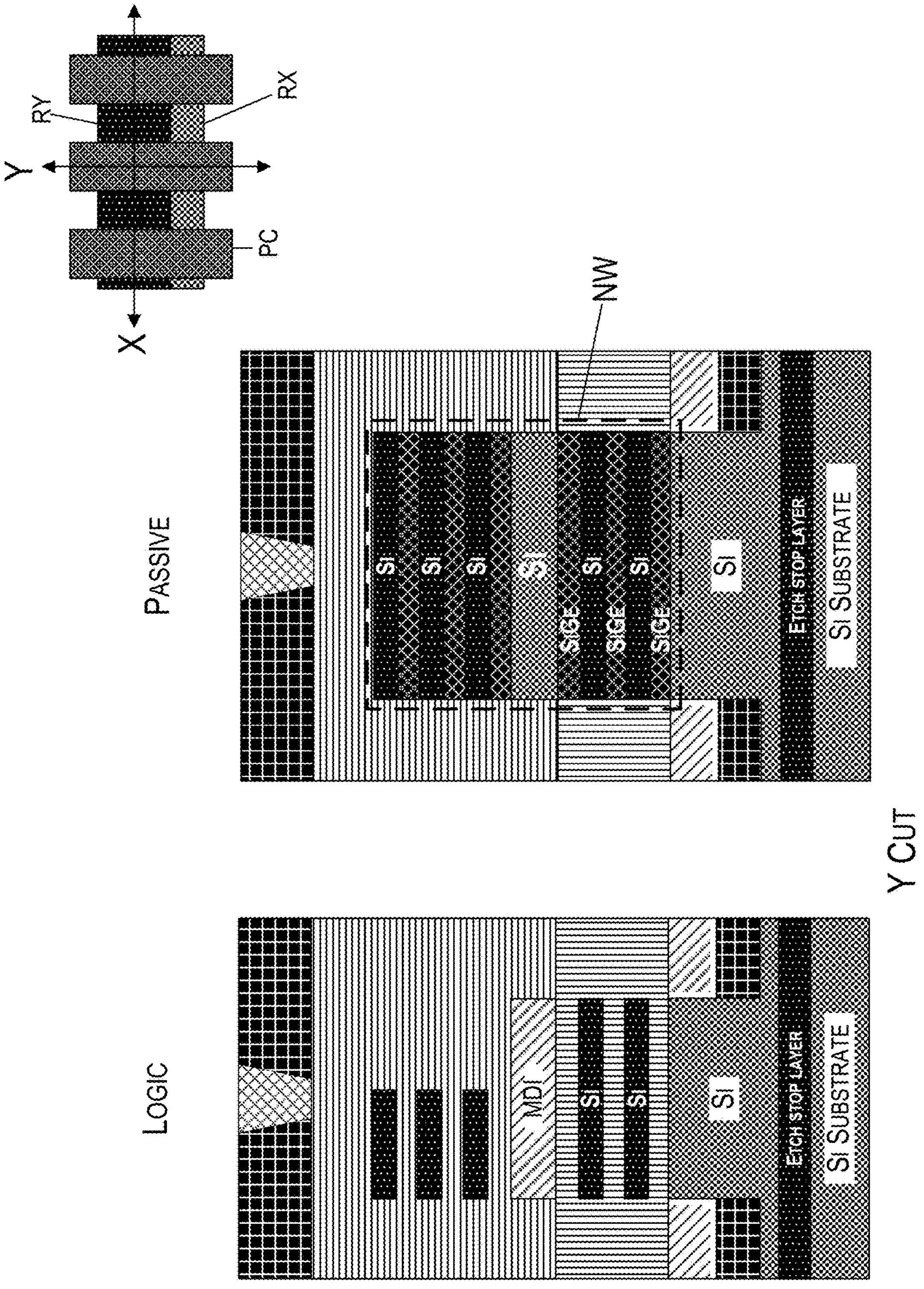

FIGS. 14A-14B illustrate side-views of a semiconductor device after the formation of the MOL, in accordance with some embodiments. In some embodiments, the MOL is performed. The formation of the MOL involves the formation of the metal layers and interconnects that connect various components and transistors on the semiconductor device. In several embodiments, during the MOL process, multiple metal layers are deposited and patterned on the semiconductor device. These metal layers serve as electrical connections, allowing signals to pass between different parts of the integrated circuit. In addition to metal layers, insulating layers (often made of low-k dielectric materials) can be deposited between metal layers to isolate them from each other and prevent electrical interference. In some embodiments, advanced lithography and patterning techniques are used to define the intricate patterns of metal lines and vias (vertical connections between metal layers) during the MOL process. Chemical-mechanical polishing (CMP), which involves the planarization of the semiconductor device's surface after each metal layer deposition, can be performed to ensure a flat and smooth surface for subsequent metal layers. In an embodiment, barrier and liner layers are deposited before the metal layers to enhance adhesion, prevent metal diffusion, and improve overall performance.

Figure 15A:
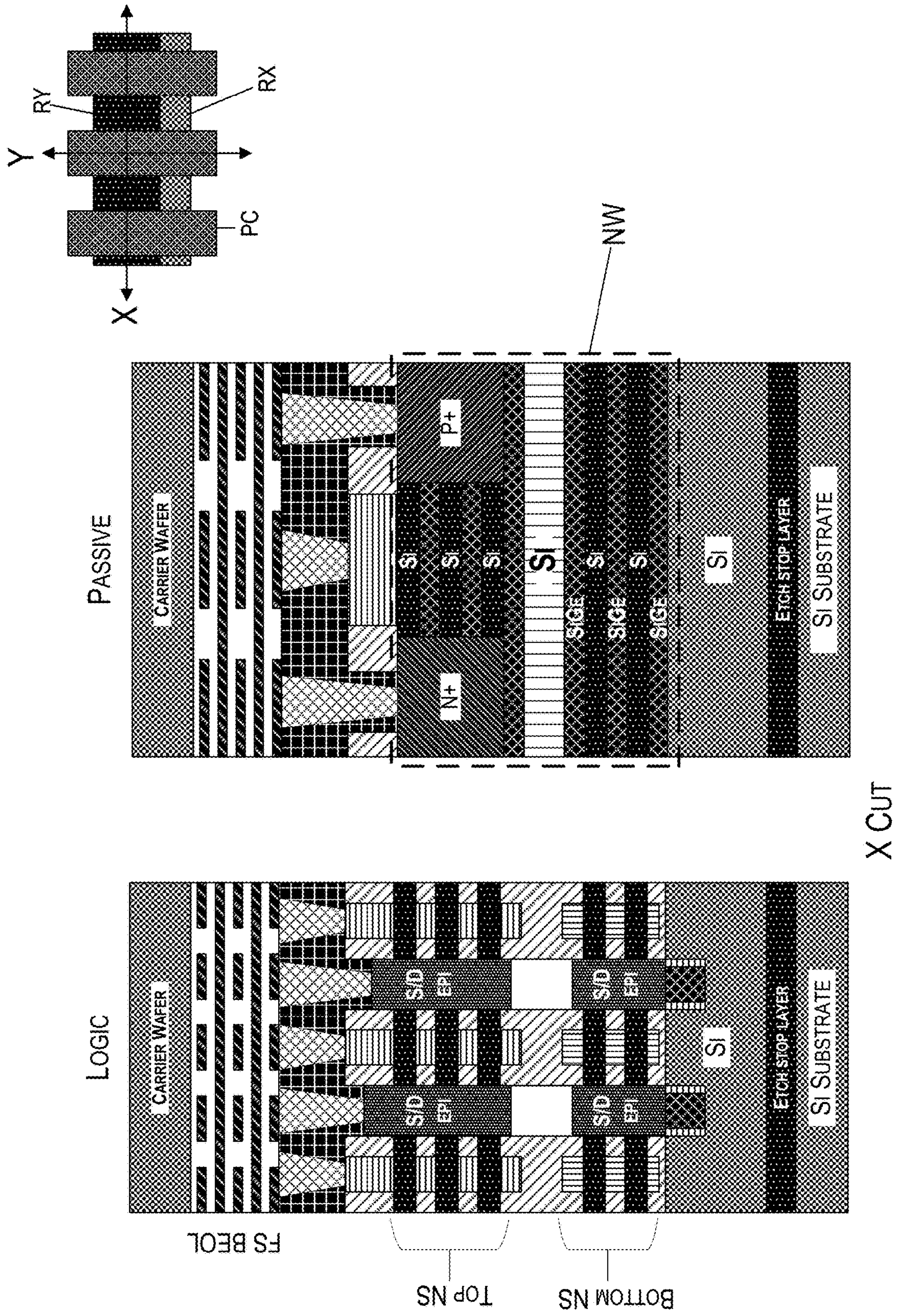
FIGS. 15A-15B illustrate side-views of a semiconductor device after the formation of the BEOL and boding carrier wafer, in accordance with some embodiments.
Figure 15B:
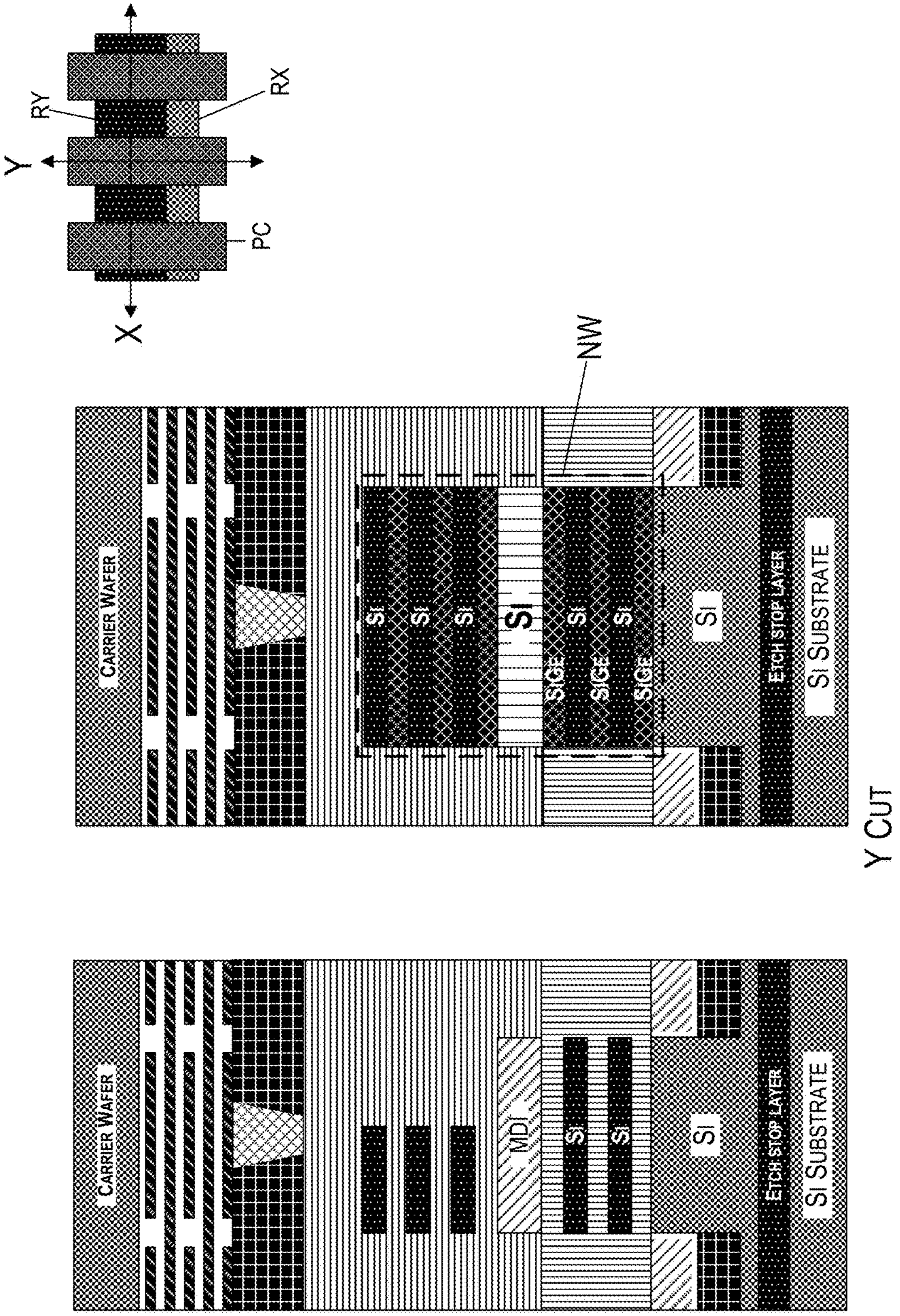

FIGS. 15A-15B illustrate side-views of a semiconductor device after the formation of the BEOL and boding carrier wafer, in accordance with some embodiments. The BEOL can include metal interconnects, e.g., wires and metal lines, and insulating layers that connect the various components of the semiconductor device and enable them to function as a cohesive unit.

In various embodiments, carrier wafer bonding, also known as wafer-to-wafer bonding or chip-to-wafer bonding, is performed to join two semiconductor devices together by creating a permanent bond between them. In some embodiments, the two semiconductor devices can be brought into contact and bonded at the atomic or molecular level, to create an interface. In an embodiment, the two semiconductor devices are brought into contact under controlled conditions, such as controlled pressure and temperature, to enable atomic or molecular bonding at the interface. Such bonding can be done at room temperature or with elevated temperatures. Alternatively, in some embodiments, an electric field and elevated temperature are utilized to create a bond. One semiconductor device can be made of semiconductor material, while the other can be a glass or silicon dioxide (SiO2) wafer. The electric field can cause ions in the glass or SiO2 to migrate and chemically bond with the semiconductor material in the other semiconductor device. In additional embodiments, a thin metal layer or metal alloy can be used as an intermediate bonding layer between the semiconductor devices. The metal layer can be deposited or transferred onto one or both semiconductor device surfaces, and the semiconductor devices can then be brought into contact and subjected to temperature and pressure to create a metallic bond.

Figure 16A:
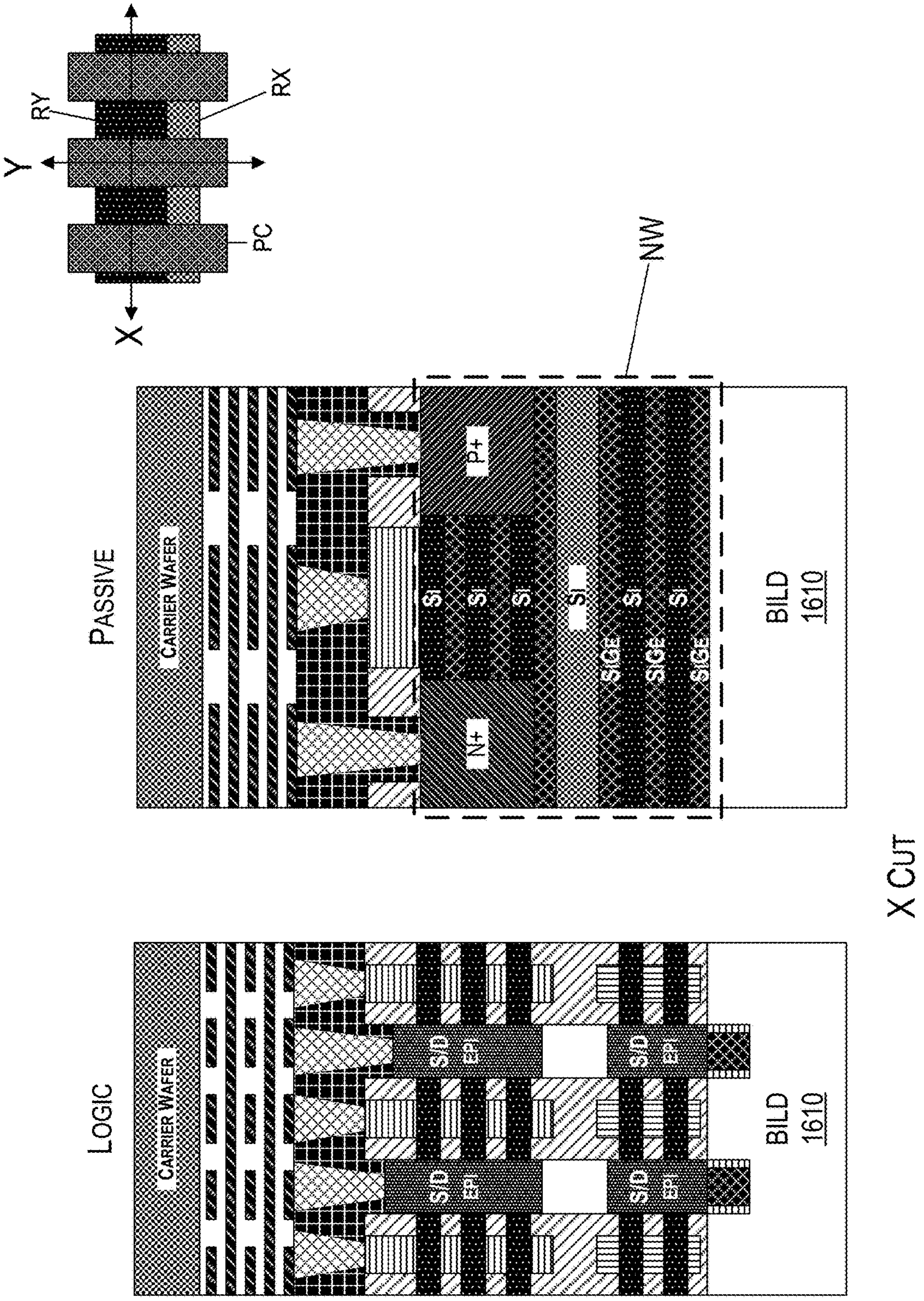
FIGS. 16A-16B illustrate side-views of a semiconductor device after the processing of the backside wafer, in accordance with some embodiments.
Figure 16B:
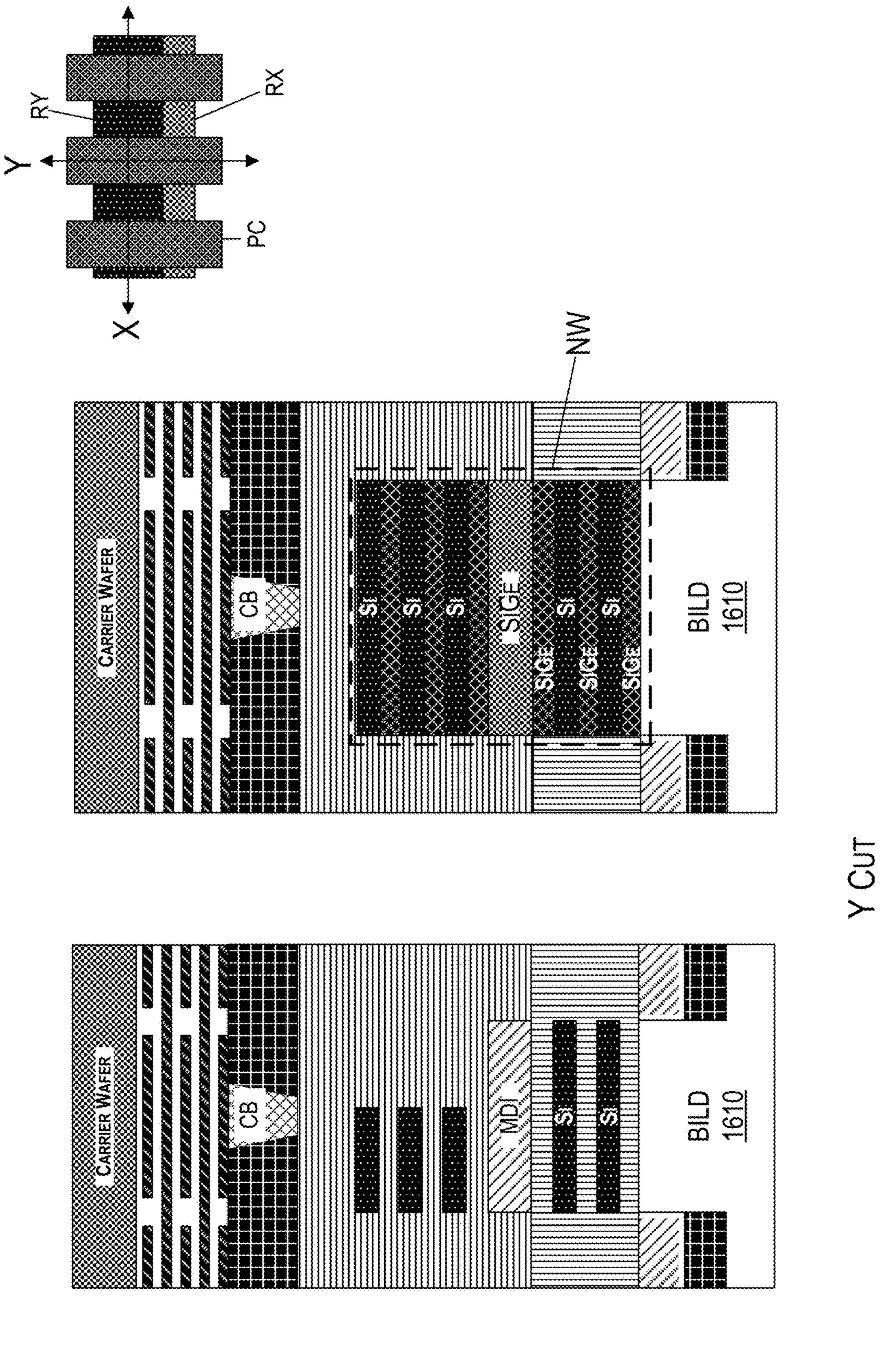

FIGS. 16A-16B illustrate side-views of a semiconductor device after the processing of the backside wafer, in accordance with some embodiments. In some embodiments, the wafer is flipped, and the first substrate, the etch stop layer, and the second substrate are removed. It should be noted that, for the sake of simplicity, the semiconductor device is not shown as flipped. The backside ILD, BILD, 1610 is formed below the epitaxial stack and the nanosheets and surrounds the placeholders and the STI.

The BILD 1610 can be an insulating material or layer used to isolate and provide electrical insulation between the semiconductor device's active regions and the placeholders. In various embodiments, the BILD 1610 can function as a protective layer, shielding the active regions of the semiconductor device from external contaminants, moisture, and mechanical stress. The BILD 1610 can further help prevent physical damage, such as scratches or particle contamination, which could adversely affect semiconductor device performance. Additionally, the BILD 1610 can function as a barrier against moisture ingress, which can cause corrosion and degradation of the semiconductor device's components. The first substrate and the second substrate can be removed by an RIE process.

Figure 17A:
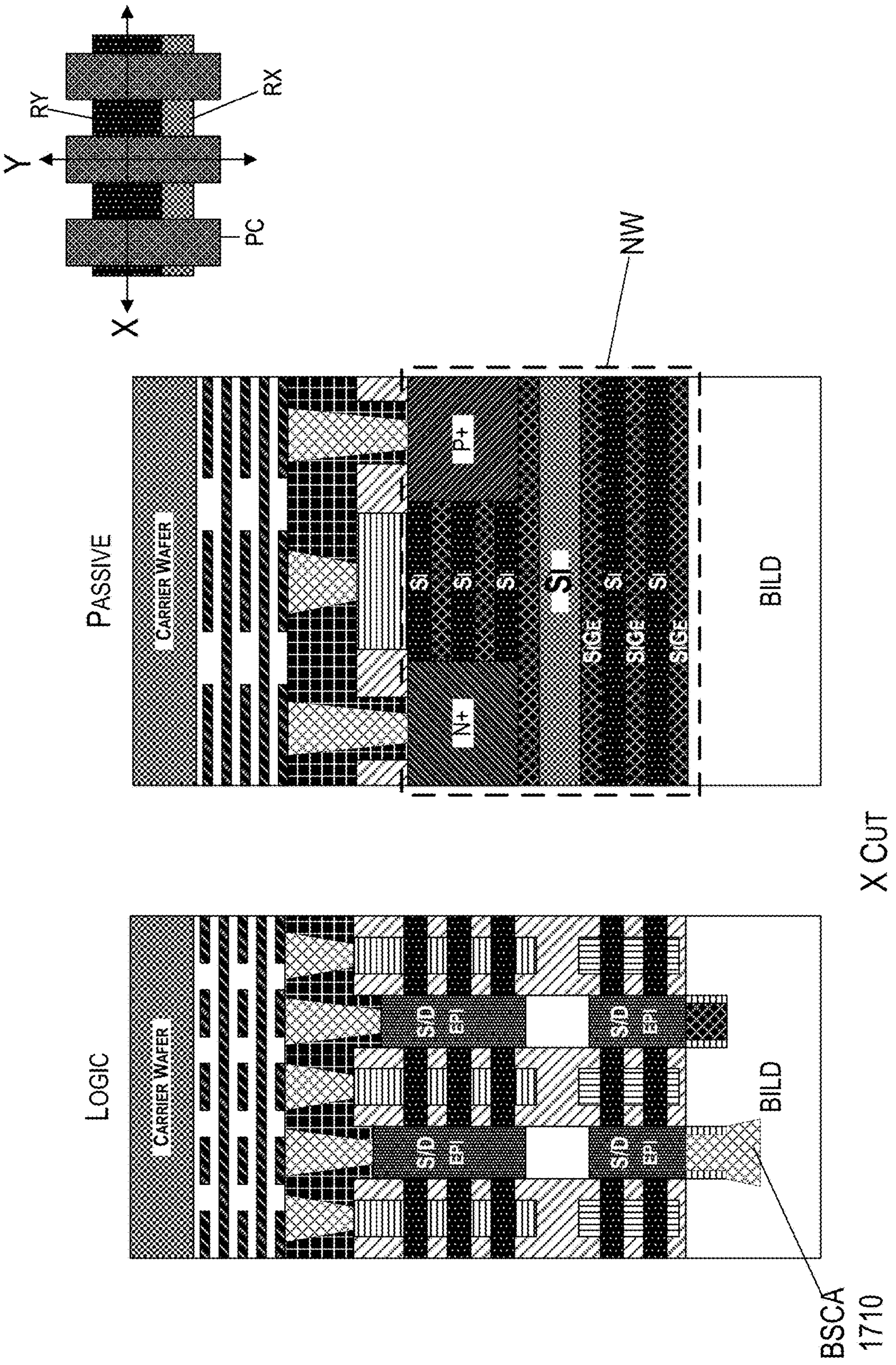
FIGS. 17A-17B illustrate side-views of a semiconductor device after the formation of the backside metal contact, in accordance with some embodiments.
Figure 17B:
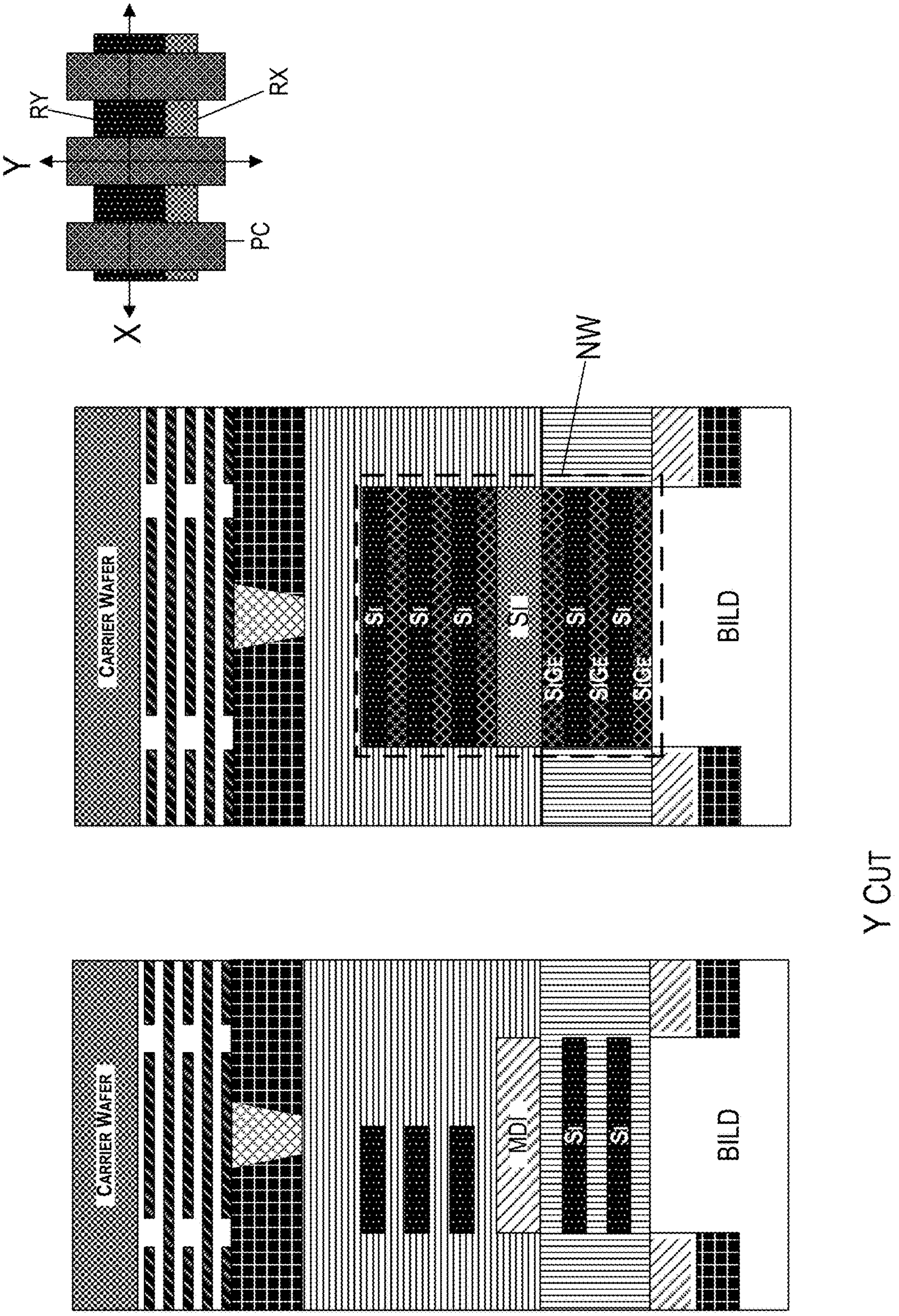

FIGS. 17A-17B illustrate side-views of a semiconductor device after the formation of the backside metal contact, in accordance with some embodiments. In some embodiments, a sacrificial placeholder can be removed so that a recess is formed that exposes the bottom of the third source/drain region. The BSCA 1710 is formed within the recess by filling with a metal contact. The BSCA 1710 is surrounded by the BILD.

Figure 18A:
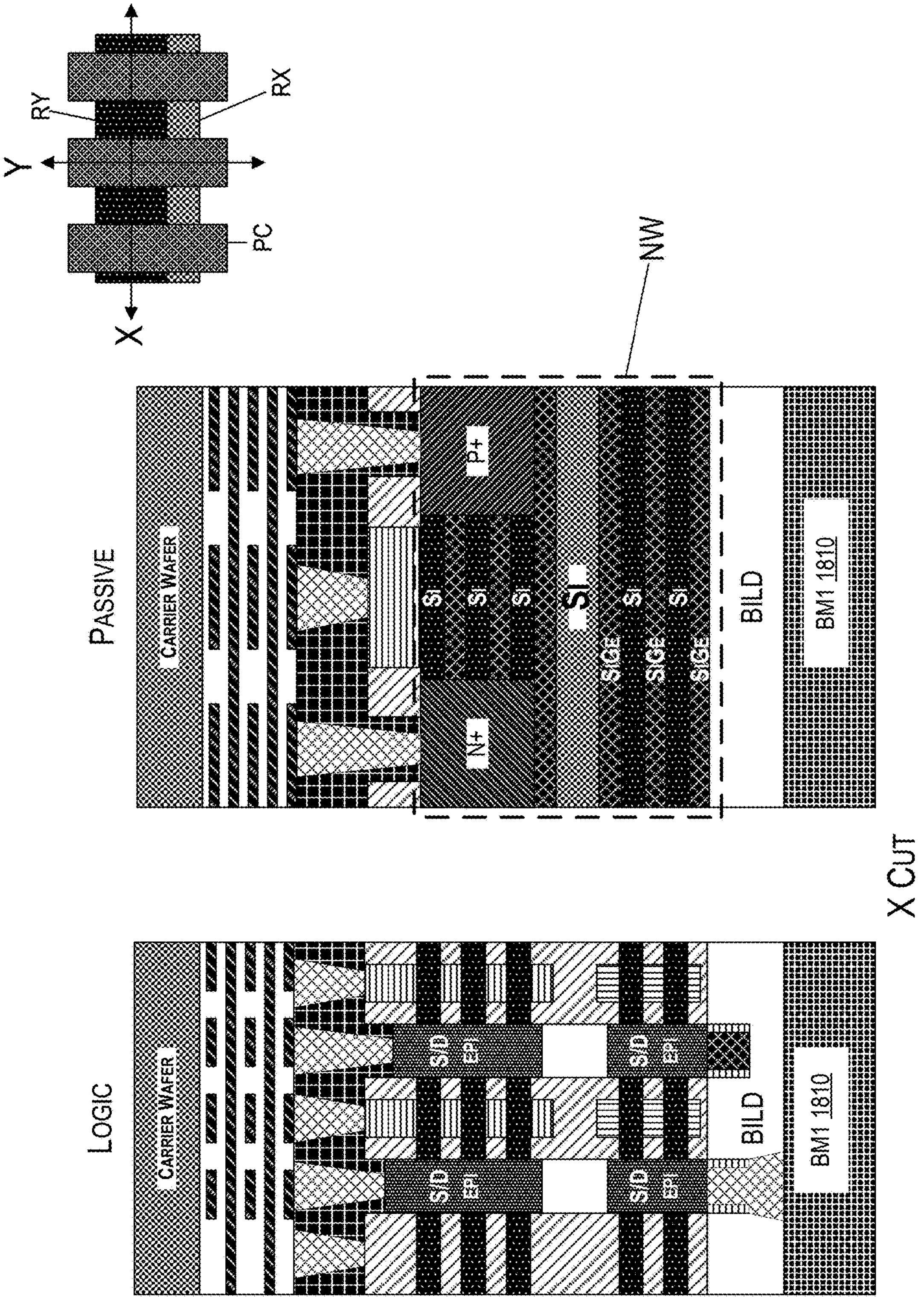
FIGS. 18A-18B illustrate side-views of a semiconductor device after the formation of the backside metal, in accordance with some embodiments.
Figure 18B:
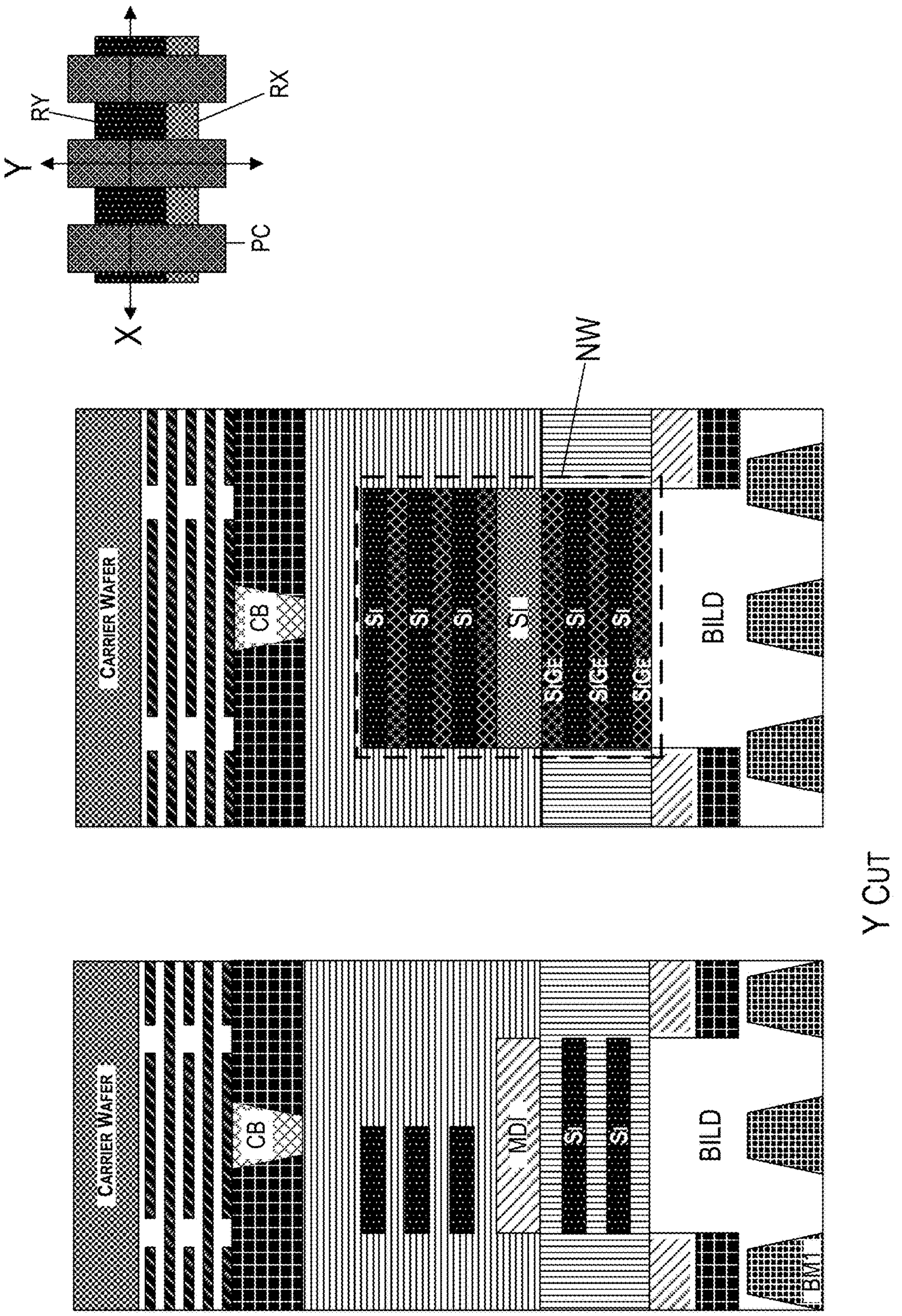

FIGS. 18A-18B illustrate side-views of a semiconductor device after the formation of the backside metal, in accordance with some embodiments. A backside metal 1810 is formed to cover the BSCA and the BILD. The backside metal 1810 can be used to connect the semiconductor device to other devices.

Figure 19A:
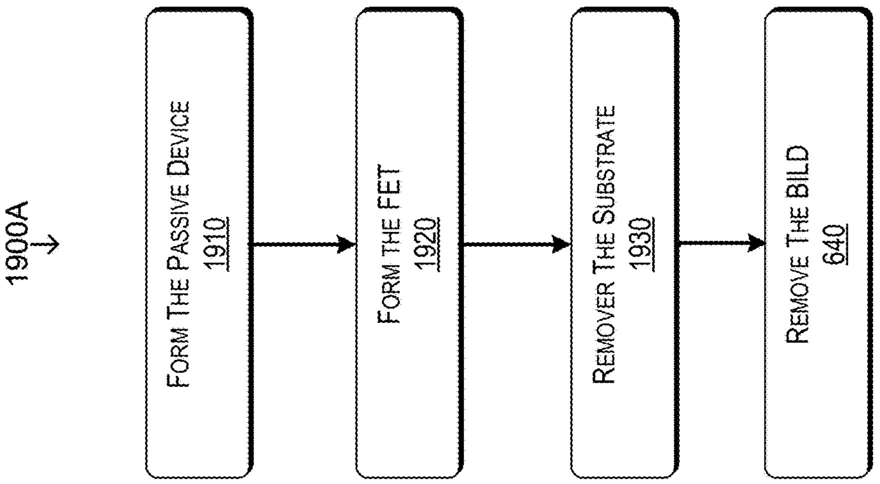
FIGS. 19A-19B illustrate block diagrams of a method for forming the semiconductor device, in accordance with some embodiments.
Figure 19B:
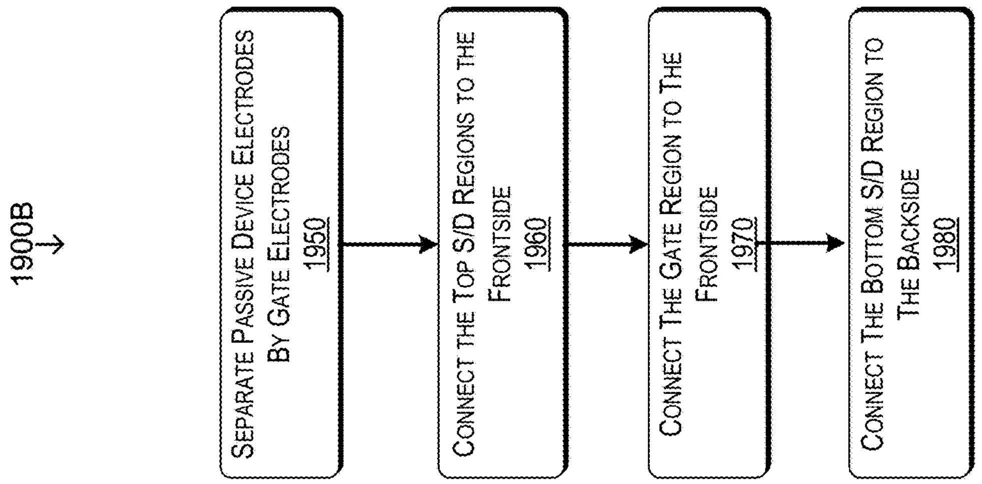

FIGS. 19A-19B illustrate block diagrams of a method 1900A for forming the semiconductor device, in accordance with some embodiments. Referring to FIG. 19A now, the method 1900A can begin when a passive device over vertically stacked epitaxial layers of a first material, and a second material over a substrate are formed, as shown by block 1910.

In an embodiment, the method 1900A proceeds when a field-effect transistor (FET) adjacent to the passive device and over the substrate is formed, as shown by block 1920.

The method 1900A continues when the substrate is removed, as shown by block 1930. At block 1940 a bottom interlayer dielectric (BILD) over the backside of the passive device and a backside of the FET is formed.

Referring to FIG. 19B now, a method 1900B for forming the semiconductor device, is shown. The method 1900B can begin when each electrode of the passive device is separated by a gate electrode of the vertically stacked epitaxial layers, as shown by block 1950. At block 1960, the source/drain regions of the top nanosheet FET are connected to the frontside of the semiconductor device via top S/D contacts.

Method 1900B can proceed when a gate region of the top nanosheet FET is connected to the frontside of the semiconductor device via a top gate contact, as shown by block 1970. At block 1980, a source/drain region of the bottom nanosheet FET is connected to the backside of the semiconductor device via backside contact, In one aspect, the method and structures described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip may be mounted in a single chip package (such as a plastic carrier, with leads that are affixed to a motherboard or other higher-level carrier) or in a multichip package (such as a ceramic carrier that has either or both surface interconnections or buried interconnections). In any case, the chip can then be integrated with other chips, discrete circuit elements, and/or other signal processing devices as part of either (a) an intermediate product, such as a motherboard, or (b) an end product. The end product can be any product that includes integrated circuit chips, ranging from low-end applications, such as toys, to advanced computer products having a display, a keyboard or other input device, and a central processor.

CONCLUSION

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications, and variations that fall within the true scope of the present teachings.

The components, steps, features, objects, benefits, and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, the inventive subject matter lies in less than all features of a single disclosed embodiment. Thus, the following claims are hereby incorporated into the Detailed Description, with each claim standing on its own as a separately claimed subject matter.

What is claimed is:

1. A semiconductor device, comprising:

a passive device comprising an N-type section, a P-type section and vertically stacked epitaxial layers of a first material and second material, wherein the N-type section and P-type section are spaced apart from each other and are located in an upper portion of the vertically stacked epitaxially layers; and a field-effect transistor (FET) adjacent to the passive device, wherein a backside of a lower portion of the vertically stacked epitaxially layers of the passive device and a backside of the FET are directly in contact with a backside metal via a bottom interlayer dielectric (BILD), and wherein the N-type section and the P-type section are entirely spaced apart from the BILD by the lower portion of the vertically stacked epitaxially layers.

2. The semiconductor device of claim 1, wherein the passive device is a P/N junction diode.

3. The semiconductor device of claim 2, wherein the P/N junction diode comprises electrodes and each electrode of the P/N junction diode is separated by a gate electrode located on the vertically stacked epitaxial layers.

4. The semiconductor device of claim 1, wherein the passive device includes a junction diode, an electrostatic discharging device (ESD), or a bipolar junction transistor (BJT).

5. The semiconductor device of claim 1, wherein the first material includes Si, and the second material includes SiGe.

6. The semiconductor device of claim 1, wherein:

the FET is a vertically stacked FET; and the vertically stacked FET includes a top nanosheet FET stacked over a bottom nanosheet FET.

7. The semiconductor device of claim 6, wherein:

S/D regions of the top nanosheet FET are connected to a frontside of the semiconductor device via top S/D contacts; and a gate region of the top nanosheet FET is connected to the frontside of the semiconductor device via a top gate contact.

8. The semiconductor device of claim 6, wherein an S/D region of the bottom nanosheet FET is connected to a backside of the semiconductor device via backside contact.

9. The semiconductor device of claim 1, wherein the passive device further comprises a silicon layer separating the upper portion of the vertically stacked epitaxial layers from the lower portion of the vertically stacked epitaxially layers.

10. A method for forming a semiconductor device, the method comprising:

forming an N-type section and a P-type section in an upper portion of vertically stacked epitaxial layers of a first material and a second material and above a substrate, wherein the N-type section, P-type section and the vertically stacked epitaxial layers comprise a passive device;

forming a field-effect transistor (FET) adjacent to the passive device over the substrate;

removing the substrate; and forming a bottom interlayer dielectric (BILD) on a backside of a lower portion of the vertically stacked epitaxial layers of the passive device and a backside of the FET, wherein the N-type section and the P-type section are entirely spaced apart from the BILD by the lower portion of the vertically stacked epitaxially layers.

11. The method of claim 10, wherein the passive device is a P/N junction diode.

12. The method of claim 11, wherein the P/N junction diode comprises electrodes and each electrode of the P/N junction diode is separated by a gate electrode located on the vertically stacked epitaxial layers.

13. The method of claim 10, wherein the passive device includes a junction diode, an electrostatic discharging device (ESD), or a bipolar junction transistor (BJT).

14. The method of claim 10, wherein:

the first material includes Si; and the second material includes SiGe.

15. The method of claim 10, wherein forming the FET comprises stacking a top nanosheet FET over a bottom nanosheet FET.

16. The method of claim 15, further comprising:

connecting S/D regions of the top nanosheet FET to a frontside of the semiconductor device via top S/D contacts; and connecting a gate region of the top nanosheet FET to the frontside of the semiconductor device via a top gate contact.

17. The method of claim 15, further comprising connecting an S/D region of the bottom nanosheet FET to a backside of the semiconductor device via backside contact.

18. The method of claim 10, wherein the passive device further comprises a silicon layer separating the upper portion of the vertically stacked epitaxial layers from the lower portion of the vertically stacked epitaxially layers.

19. The method of claim 10, further comprising forming a bottom metal over a bottom surface of the BILD.

* * * * *